US012740486B2

(12) United States Patent
Shih

(10) Patent No.: US 12,740,486 B2
(45) Date of Patent: Sep. 15, 2026

(54) ELECTRONIC DEVICE INCLUDING STACKED SEMICONDUCTOR CHIPS AND METHOD OF MANUFACTURING THE SAME

(71) Applicant: NANYA TECHNOLOGY CORPORATION, New Taipei City (TW)

(72) Inventor: Shing-Yih Shih, New Taipei City (TW)

(73) Assignee: NANYA TECHNOLOGY CORPORATION, New Taipei City (TW)

(*) Notice: Subject to any disclaimer, the term of this patent is extended or adjusted under 35 U.S.C. 154(b) by 374 days.

(21) Appl. No.: 18/371,588

(22) Filed: Sep. 22, 2023

(65) Prior Publication Data

US 2025/0105210 A1 Mar. 27, 2025

(51) Int. Cl.
*H10W 90/00* (2026.01)
*H10W 72/00* (2026.01)
(Continued)

(52) U.S. Cl.
CPC .......... *H10W 90/00* (2026.01); *H10W 74/111* (2026.01); *H10W 99/00* (2026.01); (Continued)

(58) Field of Classification Search
CPC ..... H01L 25/0657; H01L 24/73; H01L 24/80; H01L 24/96; H01L 2224/08145; H01L 2224/16145; H01L 2224/32145; H01L 2224/73204; H01L 2224/85897; H01L 2225/06541; H01L 2225/06548; H01L 2225/06524; H01L 23/3128; H10W 90/00; H10W 90/20; H10W 90/26;
(Continued)

(56) References Cited

U.S. PATENT DOCUMENTS

| | | | | |
|---|---|---|---|---|
| 9,171,819 | B2 * | 10/2015 | Lee | H10W 74/121 |
| 9,515,057 | B2 * | 12/2016 | Ma | H10W 74/117 |
| 2018/0096979 | A1 * | 4/2018 | Pappu | G11C 29/78 |
| 2021/0343547 | A1 | 11/2021 | Chang et al. | |

(Continued)

FOREIGN PATENT DOCUMENTS

| | | | |
|---|---|---|---|
| TW | 202036831 | A | 10/2020 |
| TW | 202243035 | A | 11/2022 |
| TW | 202244771 | A | 11/2022 |
| TW | 202335213 | A | 9/2023 |

OTHER PUBLICATIONS

Office Action and and the search report mailed on Apr. 14, 2025 related to Taiwanese Application No. 113117132.

(Continued)

*Primary Examiner* — Zandra V Smith
*Assistant Examiner* — Vicente Rolando Gonzales
(74) *Attorney, Agent, or Firm* — Xuan Zhang

(57) ABSTRACT

An electronic device and a manufacturing method are provided. The electronic device includes a first semiconductor chip, a second semiconductor chip and a third semiconductor chip. The second semiconductor chip is stacked on the first semiconductor chip, and is electrically connected to the first semiconductor chip by hybrid bonding. The third semiconductor chip is stacked on the second semiconductor chip, and is electrically connected to the second semiconductor chip through a plurality of bumps.

18 Claims, 20 Drawing Sheets

(51) Int. Cl.
*H10W 74/10* (2026.01)
*H10W 74/15* (2026.01)
*H10W 80/00* (2026.01)
*H10W 90/20* (2026.01)
*H10W 99/00* (2026.01)

(52) U.S. Cl.
CPC ...... *H10W 72/0198* (2026.01); *H10W 72/823* (2026.01); *H10W 74/15* (2026.01); *H10W 80/314* (2026.01); *H10W 80/327* (2026.01); *H10W 90/297* (2026.01); *H10W 90/722* (2026.01); *H10W 90/724* (2026.01); *H10W 90/732* (2026.01); *H10W 90/734* (2026.01); *H10W 90/792* (2026.01)

(58) Field of Classification Search
CPC ............. H10W 74/117; H10W 74/111; H10W 74/15; H10W 72/0198; H10W 72/823; H10W 72/90
See application file for complete search history.

(56) References Cited

U.S. PATENT DOCUMENTS

2023/0018676 A1 1/2023 Ko
2023/0207525 A1* 6/2023 Mallik .................. H10W 90/00 257/668

OTHER PUBLICATIONS

Summary translation of Office Action and and the search report mailed on Apr. 14, 2025 related to Taiwanese Application No. 113117132.
Office Action with the search report mailed on Oct. 25, 2024 related to Taiwanese Application No. 112147661.
Office Action and and the search report mailed on Oct. 30, 2025 related to Taiwanese Application No. 113117132.
Summary translation of Office Action and and the search report mailed on Oct. 30 related to Taiwanese Application No. 113117132.
Office Action and and the search report mailed on Jan. 23, 2026 related to U.S. Appl. No. 18/514,089.

* cited by examiner

ELECTRONIC DEVICE INCLUDING STACKED SEMICONDUCTOR CHIPS AND METHOD OF MANUFACTURING THE SAME

TECHNICAL FIELD

The present disclosure relates to an electronic device and a method of manufacturing the same, and more particularly, to an electronic device including stacked semiconductor chips, and a method of manufacturing the same.

DISCUSSION OF THE BACKGROUND

Semiconductor electronic devices are used in a variety of electronic applications, and the dimensions of semiconductor electronic devices are continuously being scaled down to meet the current application requirements. However, a variety of issues arise during the scaling-down process and impact the final electrical characteristics, quality, cost and yield. For example, heat dissipation This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides an electronic device including a first semiconductor chip, a second semiconductor chip and a third semiconductor chip. The second semiconductor chip is stacked on the first semiconductor chip, and is electrically connected to the first semiconductor chip by hybrid bonding. The third semiconductor chip is stacked on the second semiconductor chip, and is electrically connected to the second semiconductor chip through a plurality of bumps.

Another aspect of the present disclosure provides an electronic device including a first assembly and a second assembly. The first assembly includes a first semiconductor chip and a second semiconductor chip stacked on the first semiconductor chip and electrically connected to the first semiconductor chip by hybrid bonding. The second assembly includes a third semiconductor chip and a fourth semiconductor chip stacked on the third semiconductor chip and electrically connected to the third semiconductor chip by hybrid bonding. The second assembly is electrically connected to the first assembly through a plurality of bumps.

Another aspect of the present disclosure provides a manufacturing method. The manufacturing method includes providing a first assembly including a first semiconductor chip and a second semiconductor chip stacked on the first semiconductor chip and electrically connected to the first semiconductor chip by hybrid bonding; providing a second assembly including a third semiconductor chip and a fourth semiconductor chip stacked on the third semiconductor chip and electrically connected to the third semiconductor chip by hybrid bonding; and electrically connecting the second assembly to the first assembly through a plurality of bumps.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
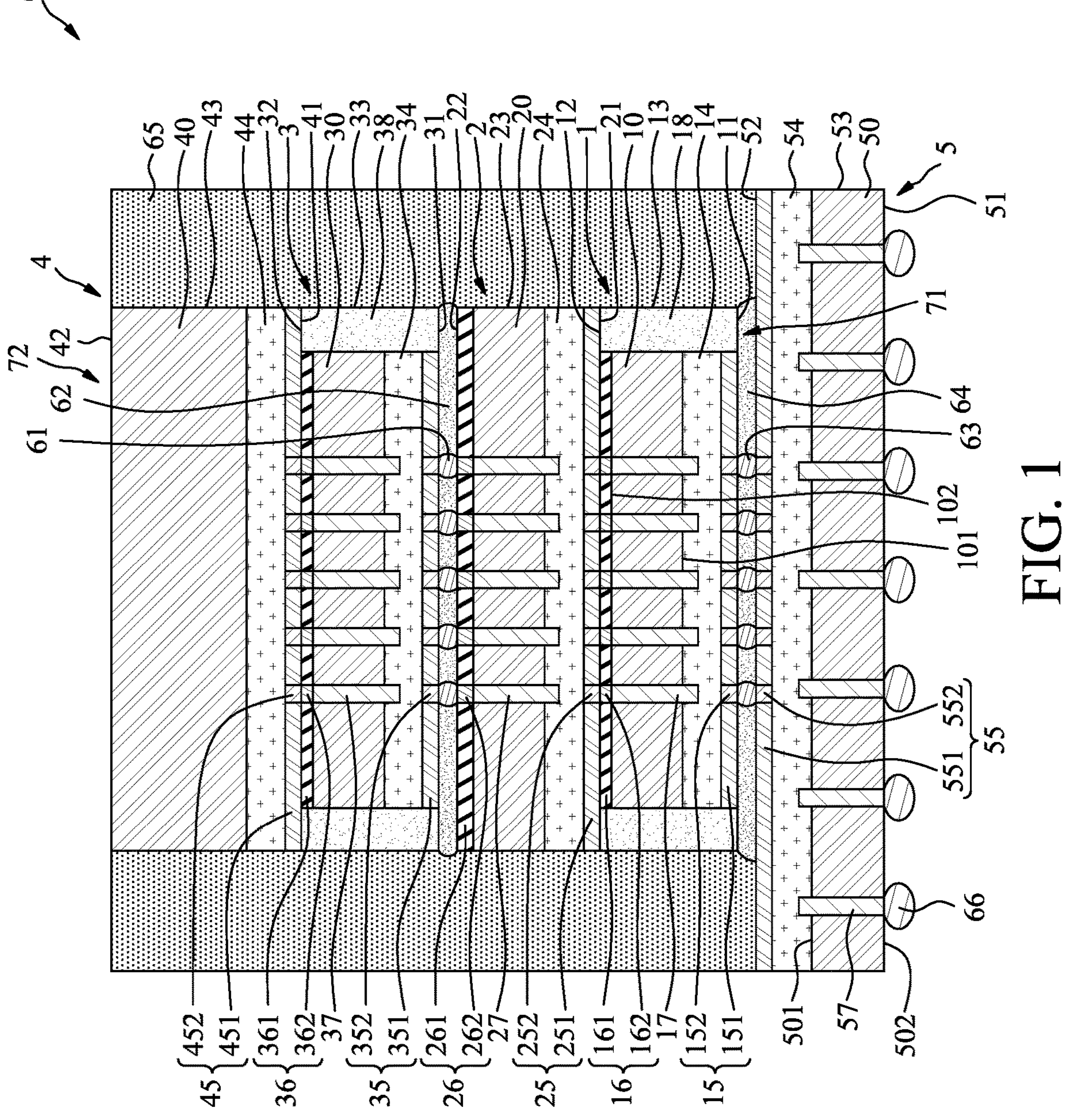
FIG. 1 is a schematic cross-sectional view of an electronic device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic cross-sectional view of an electronic device 6 in accordance with some embodiments of the present disclosure. In some embodiments, the electronic device 6 may be a semiconductor electronic device or a semiconductor electronic structure that includes a plurality of semiconductor chips stacked on one another. Thus, the electronic device 6 may be a stacked structure that includes a plurality stacked memory devices (e.g., dynamic random access memories (DRAMs)). For example, the electronic device 6 may be a high bandwidth memory (HBM). In some embodiments, the electronic device 6 may include a first assembly 71 (e.g., including a first semiconductor chip 1 and a second semiconductor chip 2), a second assembly 72 (e.g., including a third semiconductor chip 3 and a fourth semiconductor chip 4), a plurality of bumps 61, an underfill 62, a plurality of electrical connectors 63, a protection material 64, a base semiconductor chip 5, a periphery encapsulant 65 and a plurality of external connectors 66.

The first semiconductor chip 1 may have a bottom surface 11 (e.g., a first surface), a top surface 12 (e.g., a second surface) and a lateral surface 13 extending between the bottom surface 11 and the top surface 12. The first semiconductor chip 1 may include a first base portion 10, a first conductive structure 14, a first lower structure 15, a first upper structure 16, a plurality of first conductive vias 17 and a first encapsulant 18. The first semiconductor chip 1 may be a memory chip such as a dynamic random access memory (DRAM) chip.

The first base portion 10 may be a semiconductor substrate, and may include, for example, silicon (Si), doped silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some embodiments, the first base portion 10 may include a semiconductor-on-insulator substrate, such as a silicon-on-insulator (SOI) substrate, a silicon germanium-on-insulator (SGOI) substrate, or a germanium-on-insulator (GOI) substrate. The first base portion 10 may have a first surface 101 (e.g., a bottom surface) and a second surface 102 (e.g., a top surface) opposite to the first surface 101.

The first conductive structure 14 may be disposed on the first surface 101 (e.g., a bottom surface) of the first base portion 10. In some embodiments, the first conductive structure 14 may include a plurality of front-end-of-line (FEOL) devices, such as resistors, capacitors, inductors, diodes, p-type field-effect transistors (pFETs), n-type field-effect transistors (nFETs), metal-oxide semiconductor field-effect transistors (MOSFETs), complementary metal-oxide semiconductor (CMOS) transistors, bipolar junction transistors (BJTs), laterally-diffused MOS (LDMOS) transistors, high-voltage transistors, high-frequency transistors, fin field-effect transistors (FinFETs), other suitable IC components, or combinations thereof. In some embodiments, the first conductive structure 14 may further include at least one back-end-of-line (BEOL) interconnect pattern, e.g., a plurality of patterned circuit layers, electrically connected to the front-end-of-line (FEOL) devices. In some embodiments, the first conductive structure 14 may further include at least one dielectric layer or at least one dielectric structure covering the front-end-of-line (FEOL) devices and the back-end-of-line (BEOL) interconnect pattern.

The first conductive vias 17 may extend through the first base portion 10, and may be electrically connected to the first conductive structure 14. In some embodiments, a bottom end of the first conductive vias 17 may extend beyond the first surface 101 (e.g., the bottom surface) of the first base portion 10, and may extend into the first conductive structure 14. Thus, the first conductive via 17 may be a monolithic structure, and a length of the first conductive via 17 may be greater than a thickness of the first base portion 10. In some embodiments, a top surface of the first conductive via 17 may be substantially coplanar with the second surface 102 (e.g., the top surface) of the first base portion 10. Thus, the top surface of the first conductive via 17 may be exposed by the second surface 102 (e.g., the top surface) of the first base portion 10.

The first lower structure 15 may be disposed on the first conductive structure 14. The first lower structure 15 may be a hybrid bonding (HB) structure or a solder bonding structure, and may include a first lower dielectric layer 151 and a plurality of first lower pads 152. The first lower dielectric layer 151 may be a hybrid bonding (HB) dielectric layer, and may include $SiO_2$, SiCN and/or SiON. Each of the first lower pads 152 may be a hybrid bonding (HB) pad, and may include Cu or Al. The first lower pads 152 may be embedded in the first lower dielectric layer 151, and may be exposed by the first lower dielectric layer 151. The first lower pads 152 may be surrounded by the first lower dielectric layer 151. The first lower pads 152 may be electrically connected to the back-end-of-line (BEOL) interconnect pattern of the first conductive structure 14. Thus, the first lower pads 152 may be electrically connected to the first conductive vias 17 through the first conductive structure 14.

In some embodiments, a bottom surface of the first lower pad 152 may be substantially aligned with a bottom surface of the first lower dielectric layer 151. Thus, the bottom surface of the first lower pad 152 may be exposed by the bottom surface of the first lower dielectric layer 151. In some embodiments, a top surface of the first lower pad 152 may be substantially aligned with a top surface of the first lower dielectric layer 151. Thus, the top surface of the first lower pad 152 may contact the first conductive structure 14. In some embodiments, a thickness of the first lower pad 152 may be substantially equal to a thickness of the first lower dielectric layer 151.

The first upper structure 16 may be disposed on the second surface 102 (e.g., the top surface) of the first base portion 10. The first upper structure 16 may be a hybrid bonding (HB) structure, and may include a first upper dielectric layer 161 and a plurality of first upper pads 162.

The first upper dielectric layer 161 may be a hybrid bonding (HB) dielectric layer, and may include $SiO_2$, SiCN and/or SiON. Each of the first upper pads 162 may be a hybrid bonding (HB) pad, and may include Cu or Al. The first upper pads 162 may be embedded in the first upper dielectric layer 161, and may be exposed by the first upper dielectric layer 161. The first upper pads 162 may be surrounded by the first upper dielectric layer 161. The first upper pads 162 may be electrically connected to the first conductive vias 17. In some embodiments, the first upper pads 162 may directly contact the first conductive vias 17. The first upper pads 162 may be electrically connected to the first lower pad 152 through the first conductive vias 17 and the first conductive structure 14.

In some embodiments, a top surface of the first upper pad 162 may be substantially aligned with a top surface of the first upper dielectric layer 161. Thus, the top surface of the first upper pad 162 may be exposed by the top surface of the first upper dielectric layer 161. In some embodiments, a bottom surface of the first upper pad 162 may be substantially aligned with a bottom surface of the first upper dielectric layer 161. Thus, the bottom surface of the first upper pad 162 may contact the first conductive via 17. In some embodiments, a thickness of the first upper pad 162 may be substantially equal to a thickness of the first upper dielectric layer 161.

The first encapsulant 18 may be disposed around the first base portion 10, the first conductive structure 14, the first lower structure 15 and the first upper structure 16. The first encapsulant 18 may include a molding compound with or without fillers. In some embodiments, a lateral surface of the first base portion 10, a lateral surface of the first conductive structure 14, a lateral surface of the first lower structure 15 and a lateral surface of the first upper structure 16 may be aligned or coplanar with each other. Thus, the first encapsulant 18 may cover and contact the lateral surface of the first base portion 10, the lateral surface of the first conductive structure 14, the lateral surface of the first lower structure 15 and the lateral surface of the first upper structure 16.

In some embodiments, the bottom surface 11 of the first semiconductor chip 1 may include the bottom surface of the first lower pad 152, the bottom surface of the first lower dielectric layer 151 and a bottom surface of the first encapsulant 18. The top surface 12 of the first semiconductor chip 1 may include the top surface of the first upper pad 162, the top surface of the first upper dielectric layer 161 and a top surface of the first encapsulant 18. The lateral surface 13 of the first semiconductor chip 1 may be a lateral surface of the first encapsulant 18. In some embodiments, the first semiconductor chip 1 may not include the first encapsulant 18.

The second semiconductor chip 2 may be stacked on the first semiconductor chip 1, and may be electrically connected to the first semiconductor chip 1 by hybrid bonding or metal-to-metal bonding. The second semiconductor chip 2 may have a bottom surface 21 (e.g., a first surface), a top surface 22 (e.g., a second surface) and a lateral surface 23 extending between the bottom surface 21 and the top surface 22. The bottom surface 21 (e.g., the first surface) of the second semiconductor chip 2 may directly contact the top surface 12 of the first semiconductor chip 1. The lateral surface 23 of the second semiconductor chip 2 may be substantially aligned with or aligned with the lateral surface 13 of the first semiconductor chip 1.

The second semiconductor chip 2 may include a second base portion 20, a second conductive structure 24, a second lower structure 25, a second upper structure 26 and a plurality of second conductive vias 27. The second semiconductor chip 2 may be a memory chip such as a dynamic random access memory (DRAM) chip.

The second base portion 20 of the second semiconductor chip 2 may be same as or similar to the first base portion 10 of the first semiconductor chip 1. The second base portion 20 may be a semiconductor substrate, and may include, for example, silicon (Si), doped silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some embodiments, the second base portion 20 may include a semiconductor-on-insulator substrate, such as a silicon-on-insulator (SOI) substrate, a silicon germanium-on-insulator (SGOI) substrate, or a germanium-on-insulator (GOI) substrate. The second base portion 20 may have a first surface (e.g., a bottom surface) and a second surface (e.g., a top surface) opposite to the first surface. As shown in FIG. 1, a width of the second base portion 20 of the second semiconductor chip 2 may be greater than a width of the first base portion 10 of the first semiconductor chip 1.

The second conductive structure 24 of the second semiconductor chip 2 may be same as or similar to the first conductive structure 14 of the first semiconductor chip 1. The second conductive structure 24 may be disposed on the first surface (e.g., a bottom surface) of the second base portion 20. In some embodiments, the second conductive structure 24 may include a plurality of front-end-of-line (FEOL) devices, such as resistors, capacitors, inductors, diodes, p-type field-effect transistors (pFETs), n-type field-effect transistors (nFETs), metal-oxide semiconductor field-effect transistors (MOSFETs), complementary metal-oxide semiconductor (CMOS) transistors, bipolar junction transistors (BJTs), laterally-diffused MOS (LDMOS) transistors, high-voltage transistors, high-frequency transistors, fin field-effect transistors (FinFETs), other suitable IC components, or combinations thereof. In some embodiments, the second conductive structure 24 may further include at least one back-end-of-line (BEOL) interconnect pattern, e.g., a plurality of patterned circuit layers, electrically connected to the front-end-of-line (FEOL) devices. In some embodiments, the second conductive structure 24 may further include at least one dielectric layer or at least one dielectric structure covering the front-end-of-line (FEOL) devices and the back-end-of-line (BEOL) interconnect pattern. As shown in FIG. 1, a width of the second conductive structure 24 of the second semiconductor chip 2 may be greater than a width of the first conductive structure 14 of the first semiconductor chip 1.

The second conductive vias 27 may extend through the second base portion 20, and may be electrically connected to the second conductive structure 24. In some embodiments, a bottom end of the second conductive vias 27 may extend beyond the first surface (e.g., the bottom surface) of the second base portion 20, and may extend into the second conductive structure 24. Thus, the second conductive via 27 may be a monolithic structure, and a length of the second conductive via 27 may be greater than a thickness of the second base portion 20. In some embodiments, a top surface of the second conductive via 27 may be substantially coplanar with the second surface (e.g., the top surface) of the second base portion 20. Thus, the top surface of the second conductive via 27 may be exposed by the second surface (e.g., the top surface) of the second base portion 20.

The second lower structure 25 of the second semiconductor chip 2 may be same as or similar to the first lower structure 15 of the first semiconductor chip 1. The second lower structure 25 may be disposed on the second conductive structure 24. The second lower structure 25 may be a hybrid bonding (HB) structure, and may include a second lower dielectric layer 251 and a plurality of second lower pads 252. The second lower dielectric layer 251 may be a hybrid bonding (HB) dielectric layer, and may include $SiO_2$, SiCN and/or SiON. Each of the second lower pads 252 may be a hybrid bonding (HB) pad, and may include Cu or Al. The second lower pads 252 may be embedded in the second lower dielectric layer 251, and may be exposed by the second lower dielectric layer 251. The second lower pads 252 may be surrounded by the second lower dielectric layer 251. The second lower pads 252 may be electrically connected to the back-end-of-line (BEOL) interconnect pattern of the second conductive structure 24. Thus, the second lower pads 252 may be electrically connected to the second conductive vias 27 through the second conductive structure 24.

In some embodiments, a bottom surface of the second lower pad 252 may be substantially aligned with a bottom surface of the second lower dielectric layer 251. Thus, the bottom surface of the second lower pad 252 may be exposed by the bottom surface of the second lower dielectric layer 251. In some embodiments, a top surface of the second lower pad 252 may be substantially aligned with a top surface of the second lower dielectric layer 251. Thus, the top surface of the second lower pad 252 may contact the second conductive structure 24. In some embodiments, a thickness of the second lower pad 252 may be substantially equal to a thickness of the second lower dielectric layer 251.

As shown in FIG. 1, a width of the second lower structure 25 of the second semiconductor chip 2 may be greater than a width of the first lower structure 15 of the first semiconductor chip 1. The second lower structure 25 of the second semiconductor chip 2 may be bonded to and electrically connected to the first upper structure 16 of the first semiconductor chip 1 through hybrid bonding. For example, the second lower dielectric layer 251 of the second semiconductor chip 2 may be attached to, bonded to or adhered to the first upper dielectric layer 161 and the first encapsulant 18 of the first semiconductor chip 1. The second lower dielectric layer 251 of the second semiconductor chip 2 may be bonded to the first upper dielectric layer 161 of the first semiconductor chip 1 through dielectric-to-dielectric bonding. Thus, the second semiconductor chip 2 may directly contact the first encapsulant 18 of the first semiconductor chip 1.

The second lower pad 252 of the second semiconductor chip 2 may be attached to, joined to, or electrically connected to the first upper pad 162 of the first semiconductor chip 1 through metal-to-metal bonding. Thus, the second lower pad 252 of the second semiconductor chip 2 may directly contact the first upper pad 162 of the first semiconductor chip 1. A width of the second lower pad 252 of the second semiconductor chip 2 may be substantially equal to a width of the first upper pad 162 of the first semiconductor chip 1. The second semiconductor chip 2 and the first semiconductor chip 1 may be in face-to-face contact.

The second upper structure 26 of the second semiconductor chip 2 may be same as or similar to the first upper structure 16 of the first semiconductor chip 1. The second upper structure 26 may be disposed on the second surface (e.g., the top surface) of the second base portion 20. The second upper structure 26 may be a hybrid bonding (HB) structure or a solder bonding structure, and may include a second upper dielectric layer 261 and a plurality of second upper pads 262.

The second upper dielectric layer 261 may be a hybrid bonding (HB) dielectric layer, and may include $SiO_2$, SiCN and/or SiON. Each of the second upper pads 262 may be a hybrid bonding (HB) pad, and may include Cu or Al. The second upper pads 262 may be embedded in the second upper dielectric layer 261, and may be exposed by the second upper dielectric layer 261. The second upper pads 262 may be surrounded by the second upper dielectric layer 261. The second upper pads 262 may be electrically connected to the second conductive vias 27. In some embodiments, the second upper pads 262 may directly contact the second conductive vias 27. The second upper pads 262 may be electrically connected to the second lower pad 252 through the second conductive vias 27 and the second conductive structure 24.

In some embodiments, a top surface of the second upper pad 262 may be substantially aligned with a top surface of the second upper dielectric layer 261. Thus, the top surface of the second upper pad 262 may be exposed by the top surface of the second upper dielectric layer 261. In some embodiments, a bottom surface of the second upper pad 262 may be substantially aligned with a bottom surface of the second upper dielectric layer 261. Thus, the bottom surface of the second upper pad 262 may contact the second conductive via 27. In some embodiments, a thickness of the second upper pad 262 may be substantially equal to a thickness of the second upper dielectric layer 261.

In some embodiments, the bottom surface 21 of the second semiconductor chip 2 may include the bottom surface of the second lower pad 252 and the bottom surface of the second lower dielectric layer 251. The top surface 22 of the second semiconductor chip 2 may include the top surface of the second upper pad 262 and the top surface of the second upper dielectric layer 1612. The lateral surface 23 of the second semiconductor chip 2 may include a lateral surface of the second base portion 20, a lateral surface of the second conductive structure 24, a lateral surface of the second lower structure 25 and a lateral surface of the second upper structure 26. In some embodiments, the lateral surface of the second base portion 20, the lateral surface of the second conductive structure 24, the lateral surface of the second lower structure 25 and the lateral surface of the second upper structure 26 may be aligned or coplanar with each other.

The second assembly 72 may be stacked on the first assembly 71. The second assembly 72 may be spaced apart from the first assembly 71. The second assembly 72 may include a third semiconductor chip 3 and a fourth semiconductor chip 4 stacked on the third semiconductor chip 3 and electrically connected to the third semiconductor chip 3 by hybrid bonding. The second assembly 72 may be electrically connected to the first assembly 71 through the bumps 61. The bumps 61 may include a reflowable material such as AgSn. Thus, the bumps 61 may include solder balls, solder bumps or micro-bumps. In addition, the underfill 62 may be disposed between the second assembly 72 and the first assembly 71, and may cover the bumps 61.

The third semiconductor chip 3 may be stacked on the second semiconductor chip 2, and may be electrically connected to the second semiconductor chip 2 through the bumps 61. The third semiconductor chip 3 may have a bottom surface 31 (e.g., a first surface), a top surface 32 (e.g., a second surface) and a lateral surface 33 extending between the bottom surface 31 and the top surface 32. The bottom surface 31 (e.g., the first surface) of the third semiconductor chip 3 may be spaced apart from the top surface 22 of the second semiconductor chip 2. The underfill 62 may be disposed between the bottom surface 31 of the third semiconductor chip 3 and the top surface 22 of the second semiconductor chip 2 to cover the bumps 61.

The third semiconductor chip 3 may be same as or similar to the first semiconductor chip 1. The third semiconductor chip 3 may include a third base portion 30, a third conductive structure 34, a third lower structure 35, a third upper structure 36, a plurality of third conductive vias 37, and a third encapsulant 38. The third semiconductor chip 3 may be a memory chip such as a dynamic random access memory (DRAM) chip.

The third base portion 30 of the third semiconductor chip 3 may be same as or similar to the first base portion 10 of the first semiconductor chip 1. The third base portion 30 may have a first surface (e.g., a bottom surface) and a second surface (e.g., a top surface) opposite to the first surface. As shown in FIG. 1, a width of the third base portion 30 of the third semiconductor chip 3 may be substantially equal to the width of the first base portion 10 of the first semiconductor chip 1.

The third conductive structure 34 of the third semiconductor chip 3 may be same as or similar to the first conductive structure 14 of the first semiconductor chip 1. The third conductive structure 34 may be disposed on the first surface (e.g., a bottom surface) of the third base portion 30. In some embodiments, the third conductive structure 34 may include a plurality of front-end-of-line (FEOL) devices and at least one back-end-of-line (BEOL) interconnect pattern. As shown in FIG. 1, a width of the third conductive structure 34 of the third semiconductor chip 3 may be substantially equal to the first conductive structure 14 of the first semiconductor chip 1.

The third conductive vias 37 may extend through the third base portion 30, and may be electrically connected to the third conductive structure 34. In some embodiments, a bottom end of the third conductive vias 37 may extend beyond the first surface (e.g., the bottom surface) of the third base portion 30, and may extend into the third conductive structure 34. In some embodiments, a top surface of the third conductive via 37 may be substantially coplanar with the second surface (e.g., the top surface) of the third base portion 30.

The third lower structure 35 of the third semiconductor chip 3 may be same as or similar to the first lower structure 15 of the first semiconductor chip 1. The third lower structure 35 may be disposed on the third conductive structure 34. The third lower structure 35 may be a hybrid bonding (HB) structure or a solder bonding structure, and may include a third lower dielectric layer 351 and a plurality of third lower pads 352. The third lower dielectric layer 351 may be a hybrid bonding (HB) dielectric layer, and may include $SiO_2$, SiCN and/or SiON. Each of the third lower pads 352 may be a hybrid bonding (HB) pad, and may include Cu or Al. The third lower pads 352 may be embedded in the third lower dielectric layer 351, and may be exposed by the third lower dielectric layer 351. The third lower pads 352 may be electrically connected to the back-end-of-line (BEOL) interconnect pattern of the third conductive structure 34. Thus, the third lower pads 352 may be electrically connected to the third conductive vias 37 through the third conductive structure 34.

As shown in FIG. 1, a width of the third lower structure 35 of the third semiconductor chip 3 may be substantially equal to the width of the first lower structure 15 of the first semiconductor chip 1. The third lower pads 352 of the third lower structure 35 of the third semiconductor chip 3 may be bonded to and electrically connected to the second upper pads 262 of the second upper structure 26 of the second semiconductor chip 2 through the bumps 61.

The third upper structure 36 of the third semiconductor chip 3 may be same as or similar to the first upper structure 16 of the first semiconductor chip 1. The third upper structure 36 may be disposed on the second surface (e.g., the top surface) of the third base portion 30. The third upper structure 36 may be a hybrid bonding (HB) structure, and may include a third upper dielectric layer 361 and a plurality of third upper pads 362.

The third upper dielectric layer 361 may be a hybrid bonding (HB) dielectric layer, and may include $SiO_2$, SiCN and/or SiON. Each of the third upper pads 362 may be a hybrid bonding (HB) pad, and may include Cu or Al. The third upper pads 362 may be embedded in the third upper dielectric layer 361, and may be exposed by the third upper dielectric layer 361. The third upper pads 362 may be electrically connected to the third conductive vias 37. In some embodiments, the third upper pads 362 may be electrically connected to the third lower pad 352 through the third conductive vias 37 and the third conductive structure 34.

The third encapsulant 38 of the third semiconductor chip 3 may be same as or similar to the first encapsulant 18 of the first semiconductor chip 1. The third encapsulant 38 may be disposed around the third base portion 30, the third conductive structure 34, the third lower structure 35 and the third upper structure 36. The third encapsulant 38 may cover and contact the lateral surface of the third base portion 30, the lateral surface of the third conductive structure 34, the lateral surface of the third lower structure 35 and the lateral surface of the third upper structure 36.

In some embodiments, the bottom surface 31 of the third semiconductor chip 3 may include the bottom surface of the third lower pad 352, the bottom surface of the third lower dielectric layer 351 and a bottom surface of the third encapsulant 38. The top surface 32 of the third semiconductor chip 3 may include the top surface of the third upper pad 362, the top surface of the third upper dielectric layer 361 and a top surface of the third encapsulant 38. The lateral surface 33 of the third semiconductor chip 3 may be a lateral surface of the third encapsulant 38. In some embodiments, the third semiconductor chip 3 may not include the third encapsulant 38.

The fourth semiconductor chip 4 may be stacked on the third semiconductor chip 3, and may be electrically connected to the third semiconductor chip 3 by hybrid bonding or metal-to-metal bonding. The fourth semiconductor chip 4 may have a bottom surface 41 (e.g., a first surface), a top surface 42 (e.g., a second surface) and a lateral surface 43 extending between the bottom surface 41 and the top surface 42. The bottom surface 41 (e.g., the first surface) of the fourth semiconductor chip 4 may directly contact the top surface 32 of the third semiconductor chip 3. The lateral surface 43 of the fourth semiconductor chip 4 may be substantially aligned with or aligned with the lateral surface 33 of the third semiconductor chip 3.

The fourth semiconductor chip 4 may be same as or similar to the second semiconductor chip 2. The fourth semiconductor chip 4 may include a fourth base portion 40, a fourth conductive structure 44 and a fourth lower structure 45. The fourth semiconductor chip 4 may be a memory chip such as a dynamic random access memory (DRAM) chip.

The fourth base portion 40 of the fourth semiconductor chip 4 may be same as or similar to the second base portion 20 of the second semiconductor chip 2. As shown in FIG. 1, a width of the fourth base portion 40 of the fourth semiconductor chip 4 may be greater than the width of the third base portion 30 of the third semiconductor chip 3. A thickness of the fourth base portion 40 of the fourth semiconductor chip 4 may be greater than a thickness of the third base portion 30 of the third semiconductor chip 3.

The fourth conductive structure 44 of the fourth semiconductor chip 4 may be same as or similar to the second conductive structure 24 of the second semiconductor chip 2. The fourth conductive structure 44 may be disposed on the first surface (e.g., a bottom surface) of the fourth base portion 40. In some embodiments, the fourth conductive structure 44 may include a plurality of front-end-of-line (FEOL) devices and at least one back-end-of-line (BEOL) interconnect pattern. As shown in FIG. 1, a width of the fourth conductive structure 44 of the fourth semiconductor chip 4 may be greater than a width of the third conductive structure 34 of the third semiconductor chip 3.

The fourth semiconductor chip 4 may or may not include conductive vias extending in the fourth base portion 40 and electrically connecting the fourth conductive structure 44.

The fourth lower structure 45 of the fourth semiconductor chip 4 may be same as or similar to the third lower structure 35 of the third semiconductor chip 3. The fourth lower structure 45 may be disposed on the fourth conductive structure 44. The fourth lower structure 45 may be a hybrid bonding (HB) structure, and may include a fourth lower dielectric layer 451 and a plurality of fourth lower pads 452. The fourth lower dielectric layer 451 may be a hybrid bonding (HB) dielectric layer, and may include $SiO_2$, SiCN and/or SiON. Each of the fourth lower pads 452 may be a hybrid bonding (HB) pad, and may include Cu or Al. The fourth lower pads 452 may be embedded in the fourth lower dielectric layer 451, and may be exposed by the fourth lower dielectric layer 451. The fourth lower pads 452 may be electrically connected to the back-end-of-line (BEOL) interconnect pattern of the fourth conductive structure 44.

As shown in FIG. 1, a width of the fourth lower structure 45 of the fourth semiconductor chip 4 may be greater than the width of the third lower structure 35 of the third semiconductor chip 3. The fourth lower structure 45 of the fourth semiconductor chip 4 may be bonded to and electrically connected to the third upper structure 36 of the third semiconductor chip 3 through hybrid bonding. For example, the fourth lower dielectric layer 451 of the fourth semiconductor chip 4 may be attached to, bonded to or adhered to the third upper dielectric layer 361 and the third encapsulant 38 of the third semiconductor chip 3. The fourth lower dielectric layer 451 of the fourth semiconductor chip 4 may be bonded to the third upper dielectric layer 361 of the third semiconductor chip 3 through dielectric-to-dielectric bonding. Thus, the fourth semiconductor chip 4 may directly contact the third encapsulant 38 of the third semiconductor chip 3.

The fourth lower pad 452 of the fourth semiconductor chip 4 may be attached to, joined to, or electrically connected to the third upper pad 362 of the third semiconductor chip 3 through metal-to-metal bonding. The fourth semiconductor chip 4 and the third semiconductor chip 3 may be in face-to-face contact.

In some embodiments, the bottom surface 41 of the fourth semiconductor chip 4 may include the bottom surface of the fourth lower pad 452 and the bottom surface of the fourth lower dielectric layer 451. The top surface 42 of the fourth semiconductor chip 4 may include the second surface (e.g., a top surface) of the fourth base portion 40.

The base semiconductor chip 5 (or a fifth semiconductor chip 5) may have a bottom surface 51 (e.g., a first surface), a top surface 52 (e.g., a second surface) and a lateral surface 53 extending between the bottom surface 51 and the top surface 52. The base semiconductor chip 5 may include a fifth base portion 50, a fifth conductive structure 54, a fifth upper structure 55 and a plurality of fifth conductive vias 57. The base semiconductor chip 5 may be a controller chip such as an application processor (AP) chip.

The fifth base portion 50 may be a semiconductor substrate, and may include, for example, silicon (Si), doped silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. The fifth base portion 50 may have a first surface 501 (e.g., a top surface) and a second surface 502 (e.g., a bottom surface) opposite to the first surface 501.

The fifth conductive structure 54 may be disposed on the first surface 501 (e.g., the top surface) of the fifth base portion 50. In some embodiments, the fifth conductive structure 54 may include a plurality of front-end-of-line (FEOL) devices and at least one back-end-of-line (BEOL) interconnect pattern.

The fifth conductive vias 57 may extend through the fifth base portion 50, and may be electrically connected to the fifth conductive structure 54. In some embodiments, an end of the fifth conductive via 57 may extend into the fifth conductive structure 54.

The fifth upper structure 55 may be disposed on the fifth conductive structure 54. The fifth upper structure 55 may be a hybrid bonding (HB) structure or a solder bonding structure, and may include a fifth upper dielectric layer 551 and a plurality of fifth upper pads 552. The fifth upper dielectric layer 551 may be a hybrid bonding (HB) dielectric layer, and may include $SiO_2$, SiCN and/or SiON. Each of the fifth upper pads 552 may be a hybrid bonding (HB) pad, and may include Cu or Al. The fifth upper pads 552 may be embedded in the fifth upper dielectric layer 551, and may be exposed by the fifth upper dielectric layer 551. The fifth upper pads 552 may be electrically connected to the back-end-of-line (BEOL) interconnect pattern of the fifth conductive structure 54.

In some embodiments, the bottom surface 51 of the base semiconductor chip 5 may include the second surface 502 (e.g., the bottom surface) of the fifth base portion 50. The top surface 52 of the base semiconductor chip 5 may include the top surface of the fifth upper pad 552 and the top surface of the fifth upper dielectric layer 551.

The first lower pads 152 of the first lower structure 15 of the first semiconductor chip 1 may be bonded to and electrically connected to the fifth upper pad 552 of the fifth upper structure 55 of the base semiconductor chip 5 through the electrical connectors 63. The electrical connectors 63 may include a reflowable material such as AgSn. Thus, the electrical connectors 63 may include solder balls, solder bumps or micro-bumps. In addition, the protection material 64 (e.g., an underfill) may be disposed between the first semiconductor chip 1 and the base semiconductor chip 5, and may cover the electrical connectors 63.

The periphery encapsulant 65 may be a molding compound with or without fillers. The periphery encapsulant 65 may encapsulate the first semiconductor chip 1, the second semiconductor chip 2, the third semiconductor chip 3, the fourth semiconductor chip 4 and the top surface 52 of the base semiconductor chip 5. The periphery encapsulant 65 may cover the lateral surface 13 of the first semiconductor chip 1, the lateral surface 23 of the second semiconductor chip 2, the lateral surface 33 of the third semiconductor chip 3, the lateral surface 43 of the fourth semiconductor chip 4 and the top surface 52 of the base semiconductor chip 5.

The external connectors 66 may be disposed on the bottom surface 51 of the base semiconductor chip 5 for external connection. The external connectors 66 may include a reflowable material such as AgSn. Thus, the external connectors 66 may include solder balls, solder bumps or micro-bumps. The external connectors 66 may be disposed on the fifth conductive vias 57.

In the embodiment illustrated in FIG. 1, a thermal conductivity (or a thermal dissipation efficiency) of the underfill 62 may be greater than a thermal conductivity (or a thermal dissipation efficiency) of the second semiconductor chip 2 (including, for example, the second base portion 20, the second conductive structure 24, the second lower structure 25 and the second upper structure 26) and a thermal conductivity (or a thermal dissipation efficiency) of the third semiconductor chip 3 (including, for example, the third base portion 30, the third conductive structure 34, the third lower structure 35, the third upper structure 36 and the third encapsulant 38). Thus, the heat generated by the second semiconductor chip 2 and the third semiconductor chip 3 may be dissipated or transmitted to the periphery encapsulant 65 through the underfill 62 readily and quickly.

In addition, a thermal conductivity (or a thermal dissipation efficiency) of the protection material 64 may be greater than a thermal conductivity (or a thermal dissipation efficiency) of the first semiconductor chip 1 (including, for example, the first base portion 10, the first conductive structure 14, the first lower structure 15, the first upper structure 16 and the first encapsulant 18) and a thermal conductivity (or a thermal dissipation efficiency) of the base semiconductor chip 5. Thus, the heat generated by the first semiconductor chip 1 may be dissipated or transmitted to the periphery encapsulant 65 through the protection material 64 readily and quickly.

Thus, the reliability and working life of the electronic device 6 may be improved.

Figure 2:
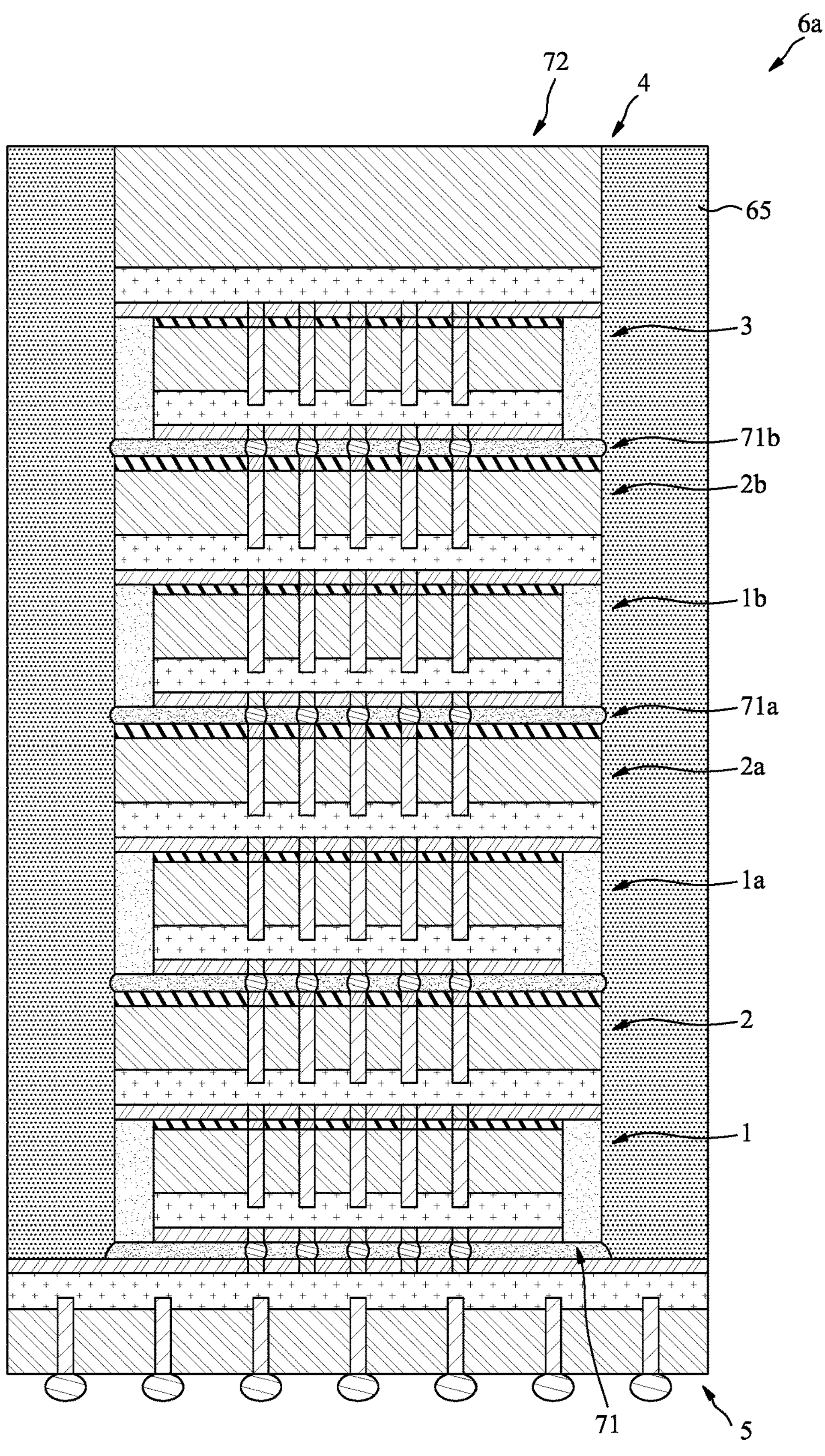
FIG. 2 is a schematic cross-sectional view of an electronic device in accordance with some embodiments of the present disclosure.

FIG. 2 is a schematic cross-sectional view of an electronic device 6*a* in accordance with some embodiments of the present disclosure. The electronic device 6*a* may be similar to the electronic device 6 of FIG. 1, and the differences are described as follows.

The electronic device 6*a* may further include a third assembly 71*a* and a fourth assembly 71*b* disposed between the first assembly 71 and the second assembly 72. The third assembly 71*a* and the fourth assembly 71*b* may be same as or similar to the first assembly 71. The third assembly 71*a* may include a sixth semiconductor chip 1*a* and a seventh semiconductor chip 2*a* same as or similar to the first semiconductor chip 1 and the second semiconductor chip 2, respectively. The third assembly 71*a* may be bonded to and electrically connected to the first assembly 71 through a plurality of bumps. In addition, the fourth assembly 71*b* may include an eighth semiconductor chip 1*b* and a ninth semiconductor chip 2*b* same as or similar to the first semiconductor chip 1 and the second semiconductor chip 2, respectively. The fourth assembly 71*b* may be bonded to and electrically connected to the third assembly 71*a* through a plurality of bumps. In addition, the second assembly 72 may be bonded to and electrically connected to the fourth assembly 71*b* through a plurality of bumps. The periphery encapsulant 65 may encapsulate the first semiconductor chip 1, the second semiconductor chip 2, the sixth semiconductor chip 1*a*, the seventh semiconductor chip 2*a*, the eighth semiconductor chip 1*b*, the ninth semiconductor chip 2*b*, the third semiconductor chip 3, the fourth semiconductor chip 4 and the top surface 52 of the base semiconductor chip 5.

Figure 3:
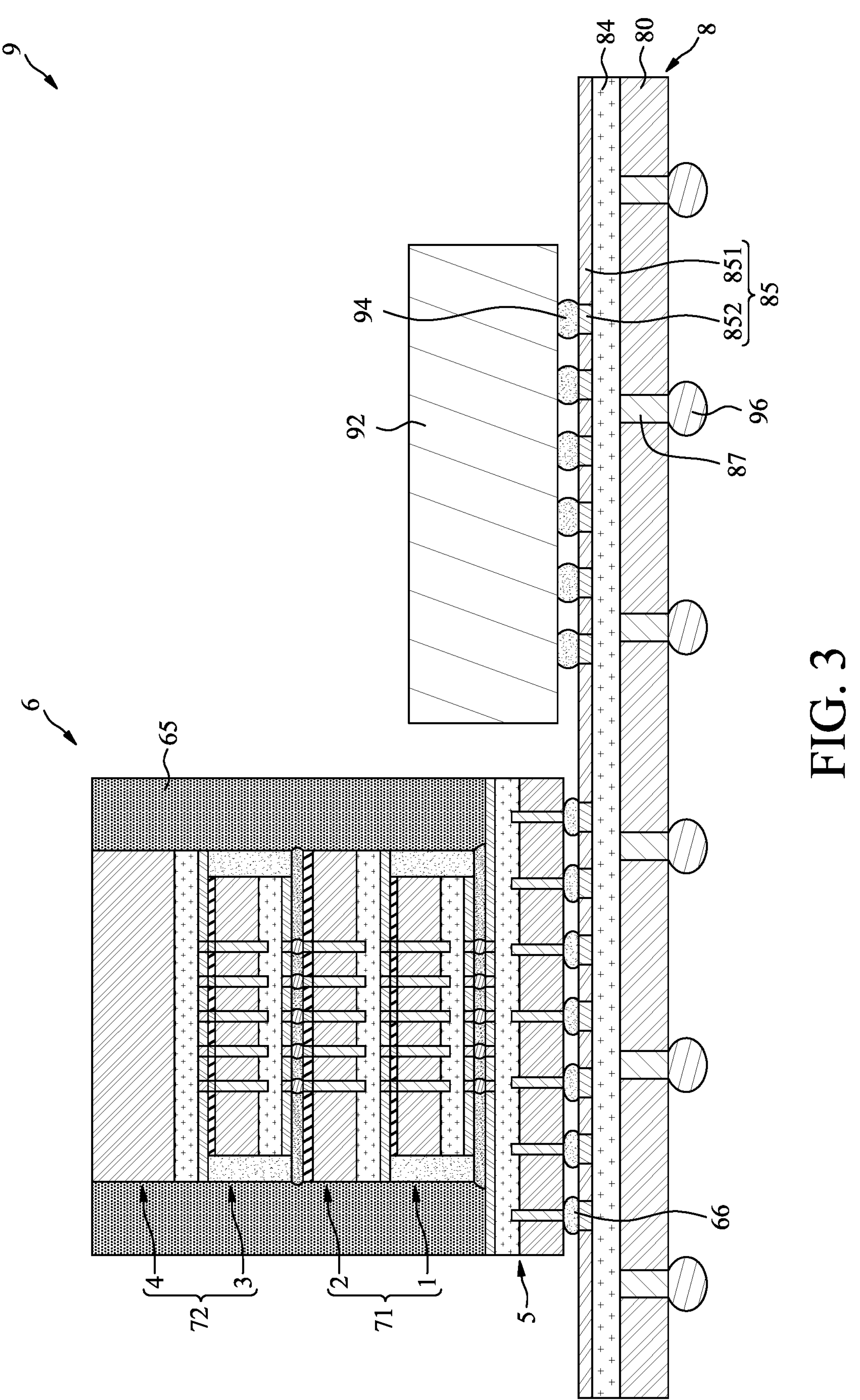
FIG. 3 is a schematic cross-sectional view of a semiconductor structure in accordance with some embodiments of the present disclosure.
Figure 4:
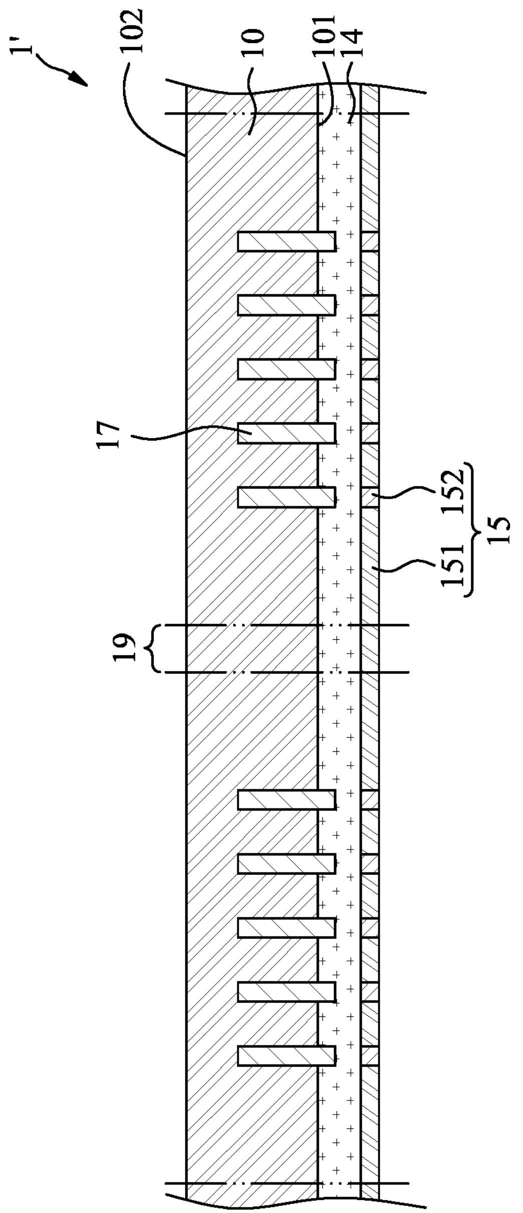
FIG. 4 to FIG. 19 illustrate various stages of a method of manufacturing an electronic device, in accordance with some embodiments of the present disclosure.

FIG. 3 is a schematic cross-sectional view of a semiconductor structure 9 in accordance with some embodiments of the present disclosure. The semiconductor structure 9 may include an interposer 8, an electronic device 6, a semiconductor device 92 and a plurality of external connectors 96.

The interposer 8 may include a base portion 80, a conductive structure 84, an upper structure 85 and a plurality of conductive vias 87. The base portion 80 may be a semiconductor substrate, and may include, for example, silicon (Si), doped silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials.

The conductive structure 84 may be disposed on the base portion 80. In some embodiments, the conductive structure 84 may include a redistribution layer (RDL) structure. The conductive vias 87 may extend through the base portion 80, and may be electrically connected to the conductive structure 84.

The upper structure 85 may be disposed on the conductive structure 84. The upper structure 85 and may include a dielectric layer 851 and a plurality of pads 852. The dielectric layer 851 may be a solder mask layer. The pads 852 may be embedded in the dielectric layer 851, and may be exposed by the dielectric layer 851.

The external connectors 96 may be disposed on the bottom surface of the interposer 8 for external connection. The external connectors 96 may include a reflowable material such as AgSn. Thus, the external connectors 96 may include solder balls, solder bumps or micro-bumps. The external connectors 96 may be disposed on the conductive vias 87.

Figure 9:
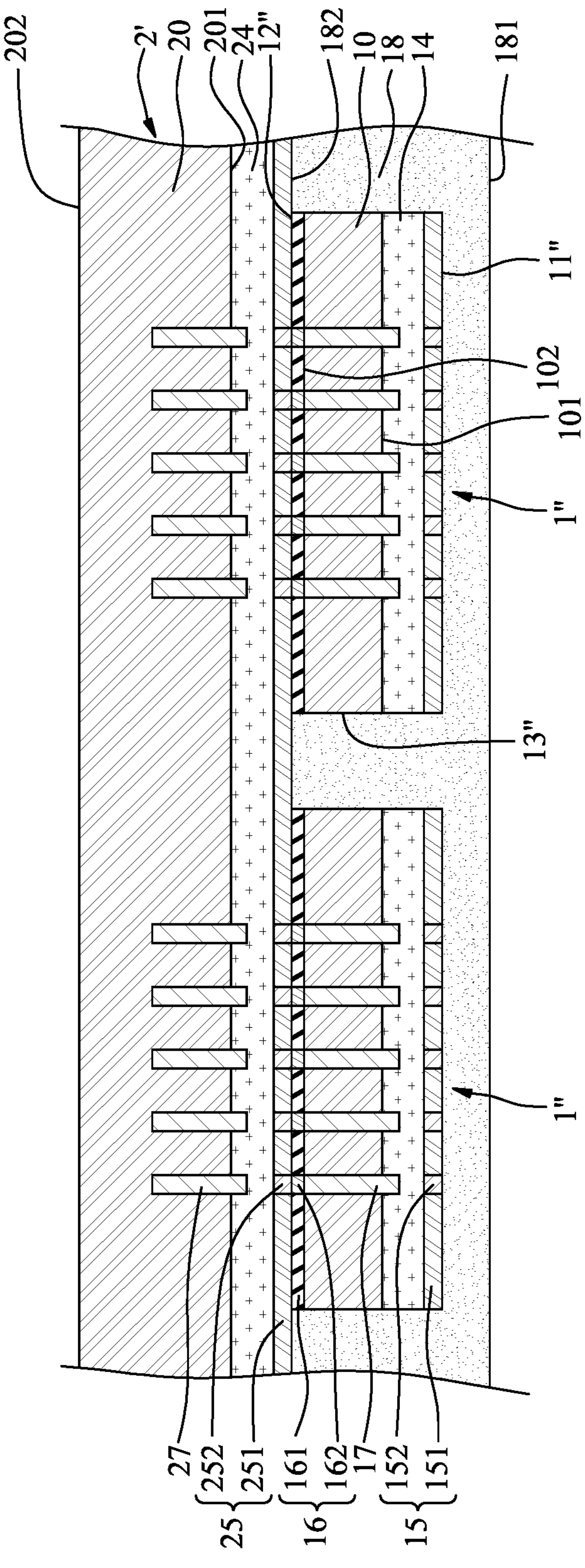

The electronic device 6 of FIG. 9 may be the electronic device 6 of FIG. 1. The electronic device 6 may be bonded to and electrically connected to the pads 852 of the interposer 8 through the external connectors 66.

The semiconductor device 92 may be a logic chip or a logic die. The semiconductor device 92 may be bonded to and electrically connected to the pads 852 of the interposer 8 through a plurality of solders 94. Thus, the electronic device 6 may be electrically connected to the semiconductor device 92 through the interposer 8.

FIG. 4 to FIG. 19 illustrate various stages of a method of manufacturing an electronic device 6, in accordance with some embodiments of the present disclosure.

Referring to FIG. 4 to FIG. 12, a first assembly 71 including a first semiconductor chip 1 and a second semiconductor chip 2 may be provided. The first assembly 71 may be manufactured as follows Referring to FIG. 4, a first wafer 1' may be provided. The first wafer 1' may include a first base portion 10, a first conductive structure 14, a first lower structure 15 and a plurality of first conductive vias 17. The first base portion 10, the first conductive structure 14, the first lower structure 15 and the first conductive vias 17 of FIG. 4 may be same as or similar to the first base portion 10, the first conductive structure 14, the first lower structure 15 and the first conductive vias 17 of FIG. 1, respectively. The first wafer 1' may define a plurality of singulation lines 19. The first base portion 10 may have a first surface 101 (e.g., a bottom surface) and a second surface 102 (e.g., a top surface) opposite to the first surface 101.

The first conductive structure 14 may be disposed on the first surface 101 (e.g., a bottom surface) of the first base portion 10. The first conductive vias 17 may extend in the first base portion 10, and may be electrically connected to the first conductive structure 14. The first lower structure 15 may be disposed on the first conductive structure 14. The first lower structure 15 may include a first lower dielectric layer 151 and a plurality of first lower pads 152. The first lower pads 152 may be embedded in the first lower dielectric layer 151, and may be exposed by the first lower dielectric layer 151.

Figure 5:
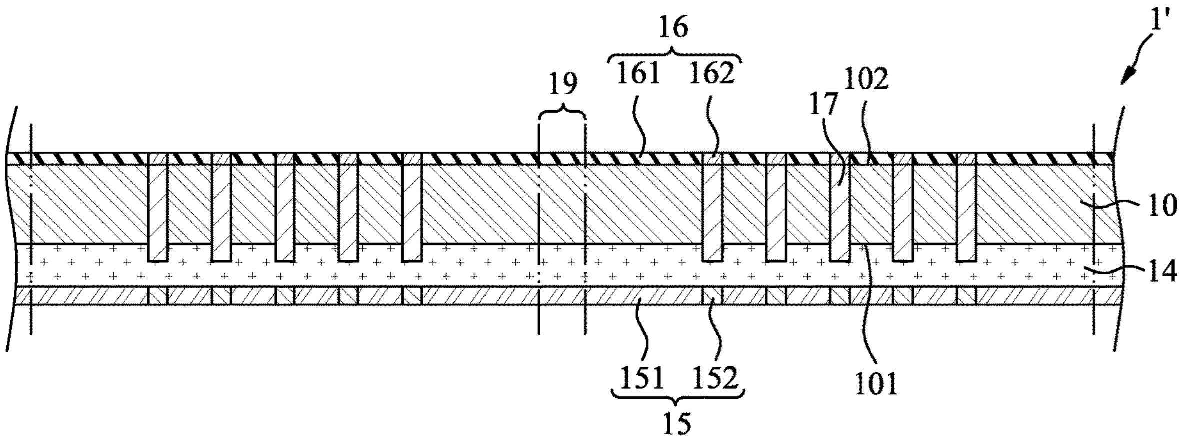

Referring to FIG. 5, the first base portion 10 may be thinned from its second surface 102 (e.g., the top surface) so as to expose the first conductive vias 17. Then, a first upper structure 16 may be formed on the second surface 102 (e.g., the top surface) of the first base portion 10. The first upper structure 16 may include a first upper dielectric layer 161 and a plurality of first upper pads 162. The first upper pads 162 may be embedded in the first upper dielectric layer 161, and may be exposed by the first upper dielectric layer 161. The first upper pads 162 may be electrically connected to the first conductive vias 17.

Figure 6:
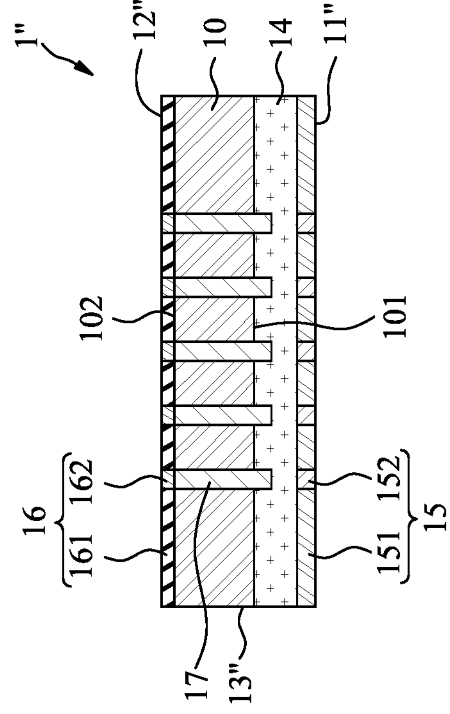

Referring to FIG. 6, the first wafer 1' may be singulated along the singulation lines 19 to form a plurality of units 1". The unit 1" has a bottom surface 11" (e.g., a first surface), a top surface 12" (e.g., a second surface) and a lateral surface 13" extending between the bottom surface 11" and the top surface 12".

Figure 7:
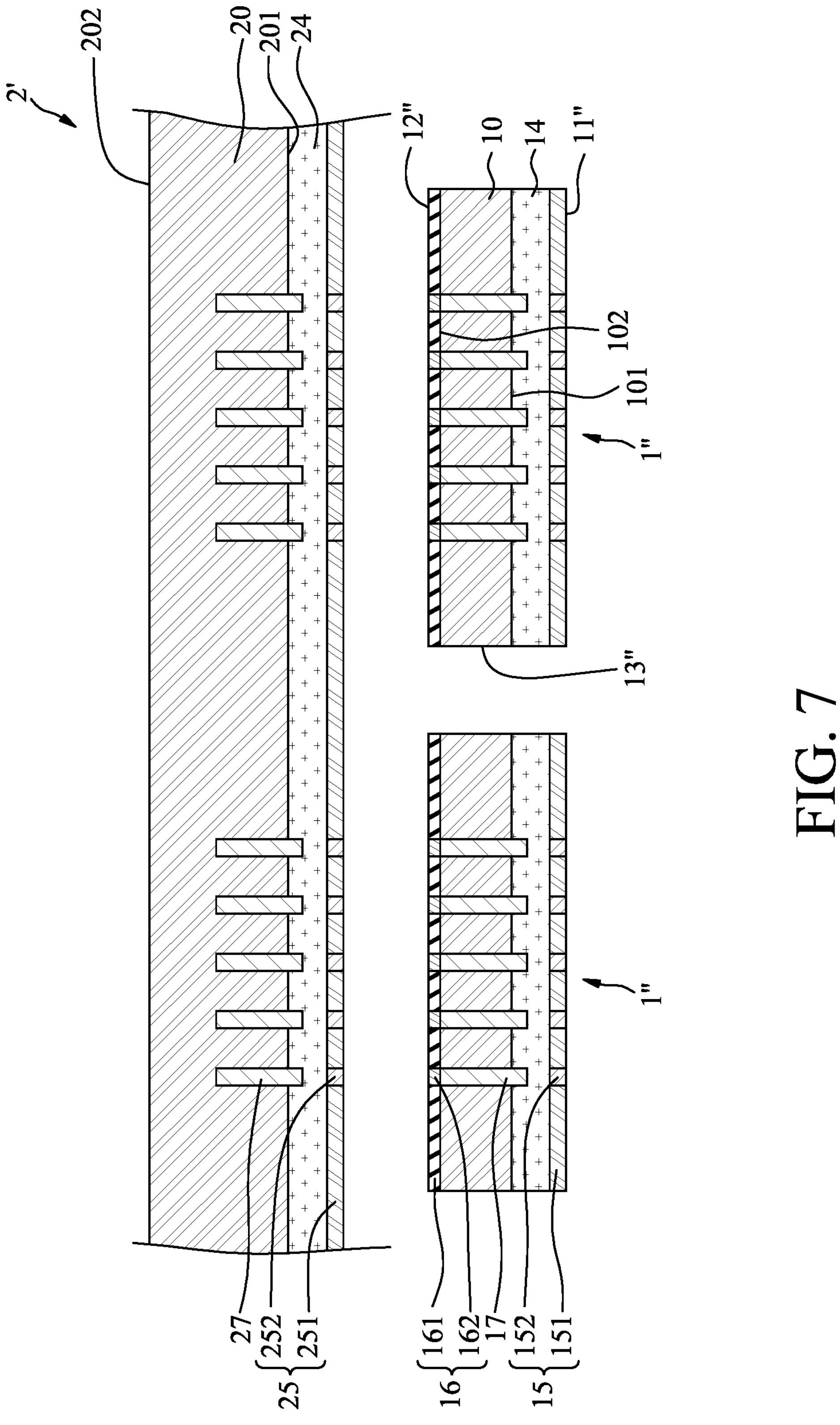

Referring to FIG. 7, a second wafer 2' may be provided. The second wafer 2' may include a second base portion 20, a second conductive structure 24, a second lower structure 25 and a plurality of second conductive vias 27. The second base portion 20, the second conductive structure 24, the second lower structure 25 and the second conductive vias 27 of FIG. 7 may be same as or similar to the second base portion 20, the second conductive structure 24, the second lower structure 25 and the second conductive vias 27 of FIG. 1, respectively. The second base portion 20 may have a first surface 201 (e.g., a bottom surface) and a second surface 202 (e.g., a top surface) opposite to the first surface 201.

The second conductive structure 24 may be disposed on the first surface 201 (e.g., a bottom surface) of the second base portion 20. The second conductive vias 27 may extend in the second base portion 20, and may be electrically connected to the second conductive structure 24. The second lower structure 25 may be disposed on the second conductive structure 24. The second lower structure 25 may include a second lower dielectric layer 251 and a plurality of second lower pads 252. The second lower pads 252 may be embedded in the second lower dielectric layer 251, and may be exposed by the second lower dielectric layer 251.

Figure 8:
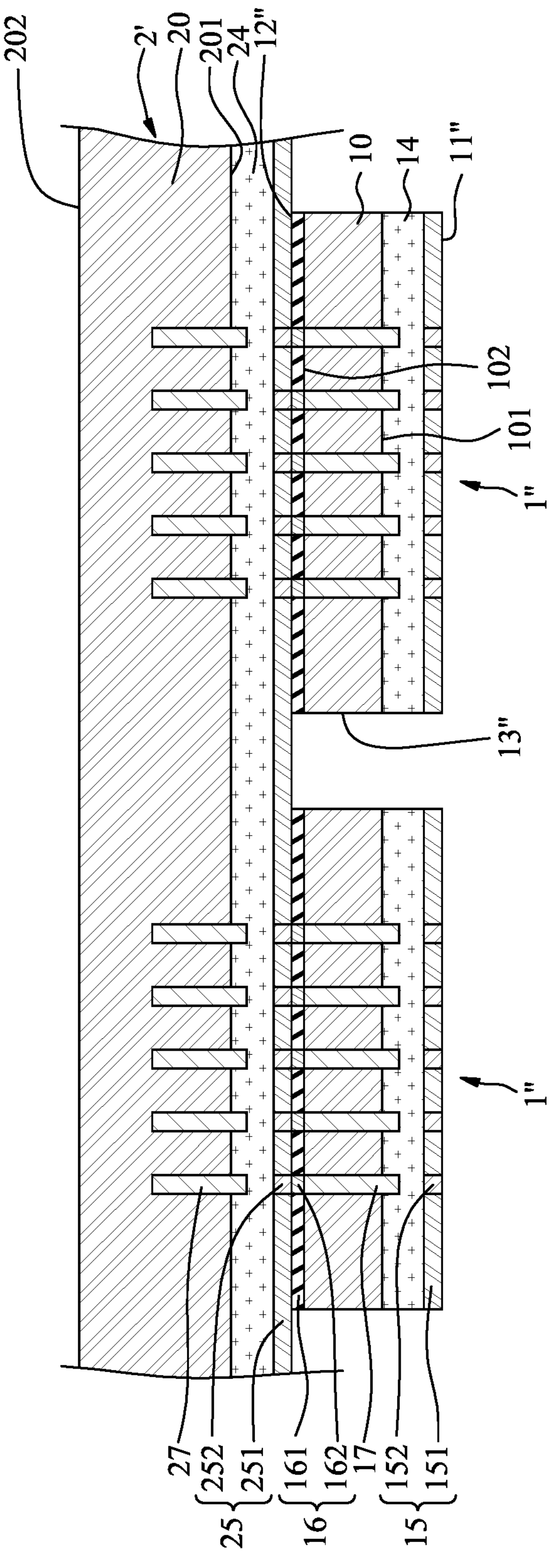

Referring to FIG. 8, a plurality of units 1" may be attached to the second wafer 2' through hybrid bonding. The first upper dielectric layer 161 of the unit 1" may be attached to, bonded to or adhered to the second lower dielectric layer 251 of the second wafer 2' through dielectric-to-dielectric bonding. The first upper pad 162 of the unit 1" may be attached to, joined to, or electrically connected to the second lower pad 252 of the second wafer 2' through metal-to-metal bonding.

Referring to FIG. 9, a first encapsulant 18 may be formed or disposed on the second lower structure 25 to cover the units 1". The first encapsulant 18 may have a first surface 181 (e.g., a bottom surface) and a second surface 182 (e.g., a top surface) opposite to the first surface 181. The first surface 181 of the first encapsulant 18 may contact the second lower structure 25. The second surface 182 of the first encapsulant 18 may be lower than the bottom surface 11" of the unit 1". Thus, the first encapsulant 18 may cover the lateral surface 13" and the bottom surface 11" of the unit 1".

Figure 10:
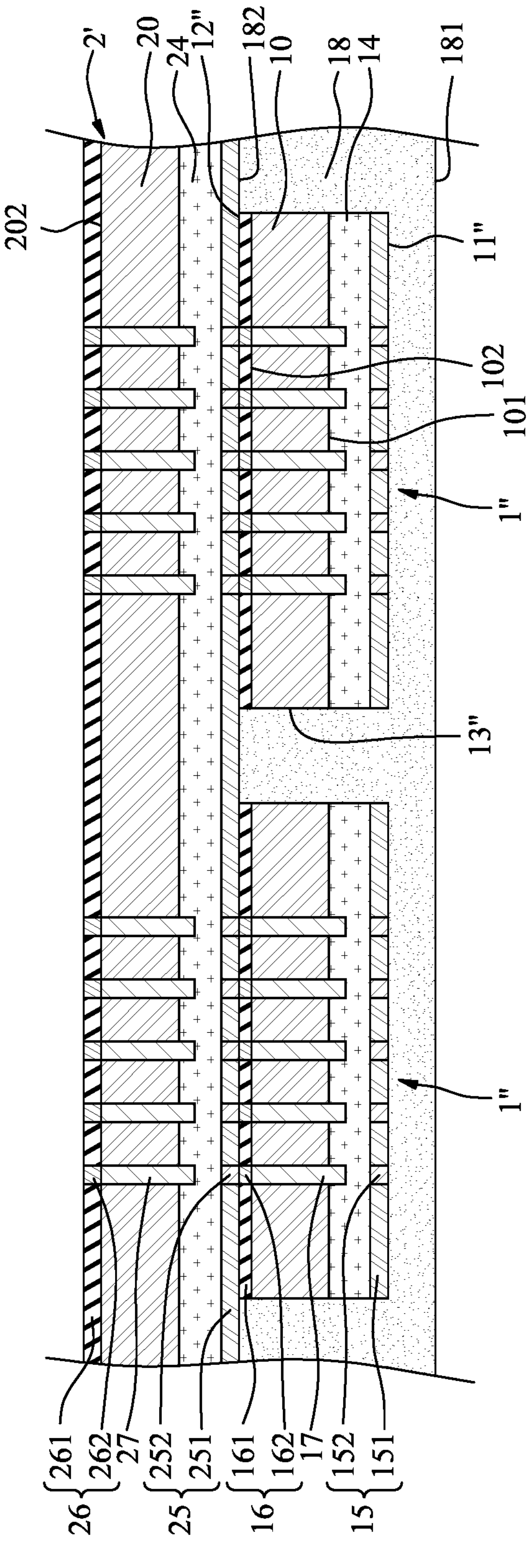

Referring to FIG. 10, the second base portion 20 may be thinned from its second surface 202 (e.g., the top surface) so as to expose the second conductive vias 27. Then, a second upper structure 26 may be formed on the second surface 202 (e.g., the top surface) of the second base portion 20. The second upper structure 26 may include a second upper dielectric layer 261 and a plurality of second upper pads 262. The second upper pads 262 may be embedded in the second upper dielectric layer 261, and may be exposed by the second upper dielectric layer 261. The second upper pads 262 may be electrically connected to the second conductive vias 27.

Figure 11:
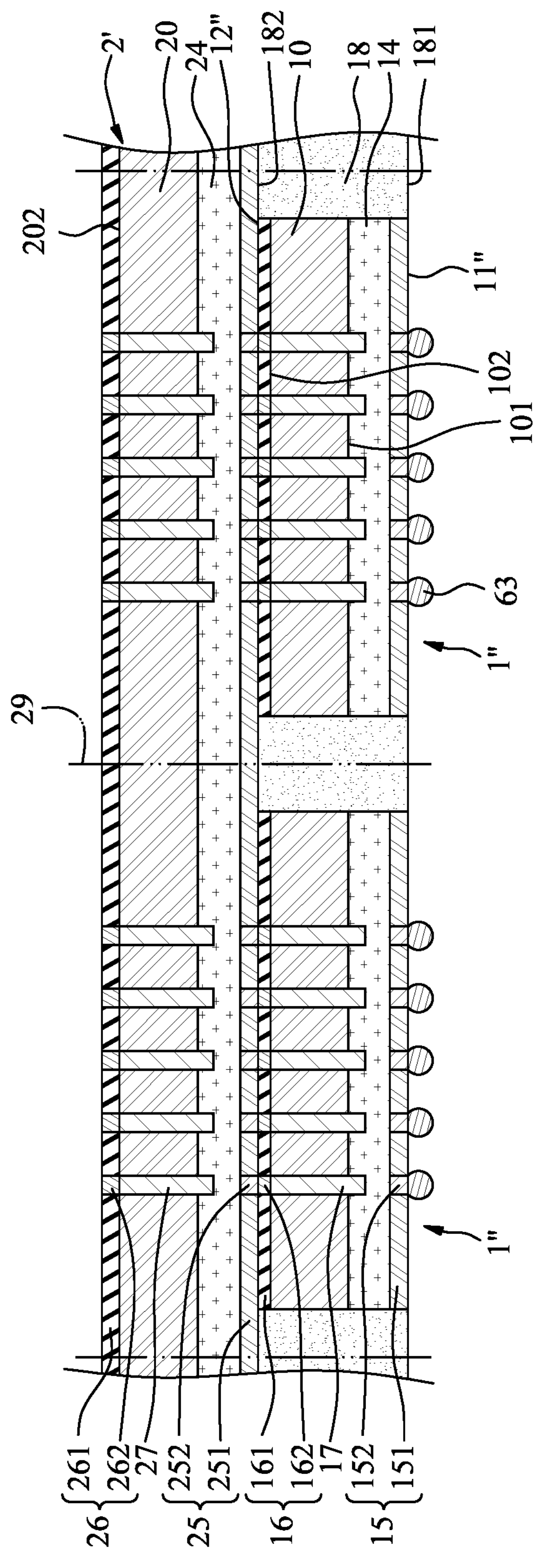

Referring to FIG. 11, the first encapsulant 18 may be thinned from its first surface 181 (e.g., the bottom surface) to expose the units 1". The first surface 181 (e.g., the bottom surface) of the first encapsulant 18 may be substantially coplanar with the bottom surfaces 11" of the units 1". Then, a plurality of electrical connectors 63 may be formed or disposed on the first lower pads 152 of the first lower structure 15 of the unit 1". The electrical connectors 63 may include a reflowable material such as AgSn. Meanwhile, the second wafer 2' and the first encapsulant 18 may define a plurality of singulation lines 29.

Figure 12:
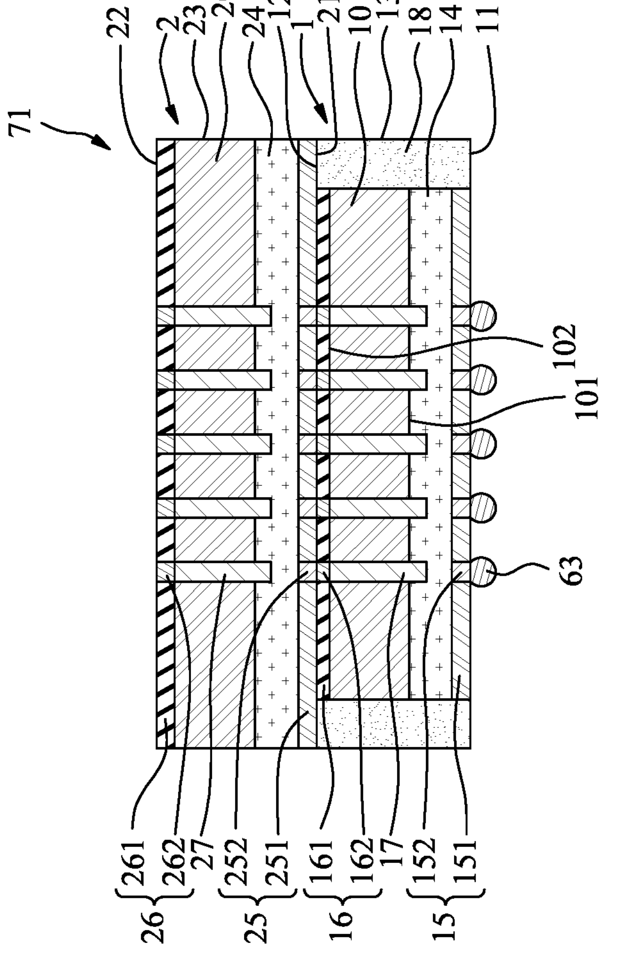
Figure 13:
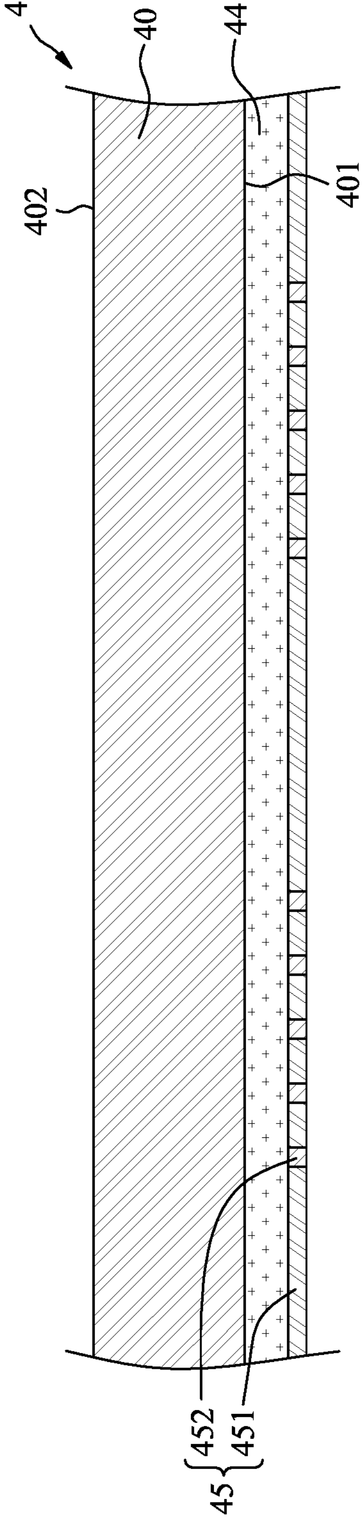

Referring to FIG. 12, the second wafer 2' and the first encapsulant 18 may be singulated along the singulation lines 29 to form a plurality of first assemblies 71. The first assembly 71 may include a first semiconductor chip 1 and a second semiconductor chip 2 stacked on the first semiconductor chip 1 and electrically connected to the first semiconductor chip 1 by hybrid bonding. The first semiconductor chip 1 may include the unit 1" and the first encapsulant 18. The second semiconductor chip 2 may be a portion that is singulated from the second wafer 2'. The first assembly 71 of FIG. 12 may be same as or similar to the first assembly 71 of FIG. 1.

Referring to FIG. 13 to FIG. 18, a second assembly 72 including a third semiconductor chip 3 and a fourth semiconductor chip 4 may be provided. The second assembly 72 may be manufactured as follows Referring to FIG. 13, a fourth wafer 4' may be provided. The fourth wafer 4' may include a fourth base portion 40, a fourth conductive structure 44 and a fourth lower structure 45. The fourth base portion 40, the fourth conductive structure 44 and the fourth lower structure 45 of FIG. 13 may be same as or similar to the fourth base portion 40, the fourth conductive structure 44 and the fourth lower structure 45 of FIG. 1, respectively.

The fourth conductive structure 44 may be disposed on the first surface 401 (e.g., a bottom surface) of the fourth base portion 40. The fourth lower structure 45 may be disposed on the fourth conductive structure 44. The fourth lower structure 45 may include a fourth lower dielectric layer 451 and a plurality of fourth lower pads 452. The fourth lower pads 452 may be embedded in the fourth lower dielectric layer 451, and may be exposed by the fourth lower dielectric layer 451.

Figure 14:
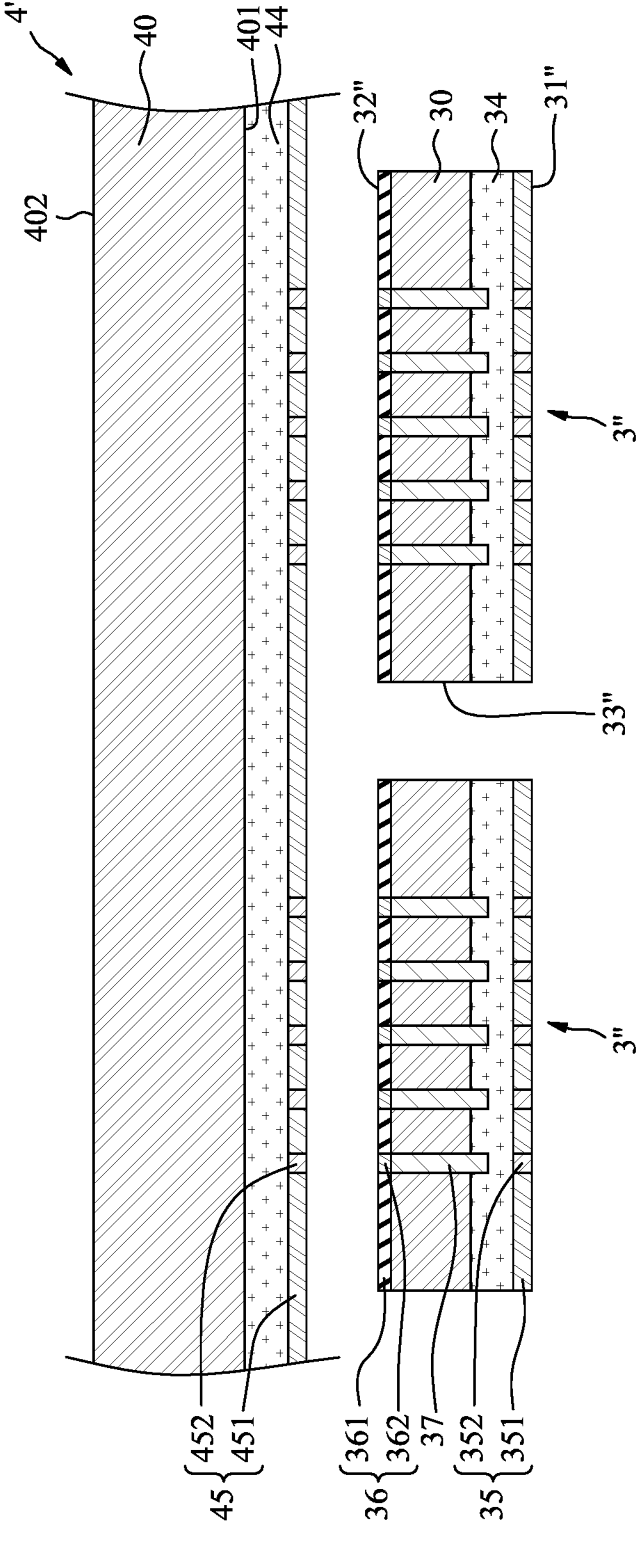

Referring to FIG. 14, a plurality of units 3" may be provided. The unit 3" may be same as or similar to the unit 1". The unit 3" may have a bottom surface 31" (e.g., a first surface), a top surface 32" (e.g., a second surface) and a lateral surface 33" extending between the bottom surface 31" and the top surface 32". The third semiconductor chip 3 may be same as or similar to the first semiconductor chip 1. The unit 3" may include a third base portion 30, a third conductive structure 34, a third lower structure 35, a third upper structure 36 and a plurality of third conductive vias 37 that are same as or similar to the third base portion 30, the third conductive structure 34, the third lower structure 35, the third upper structure 36 and the third conductive vias 37 of FIG. 1, respectively.

Figure 15:
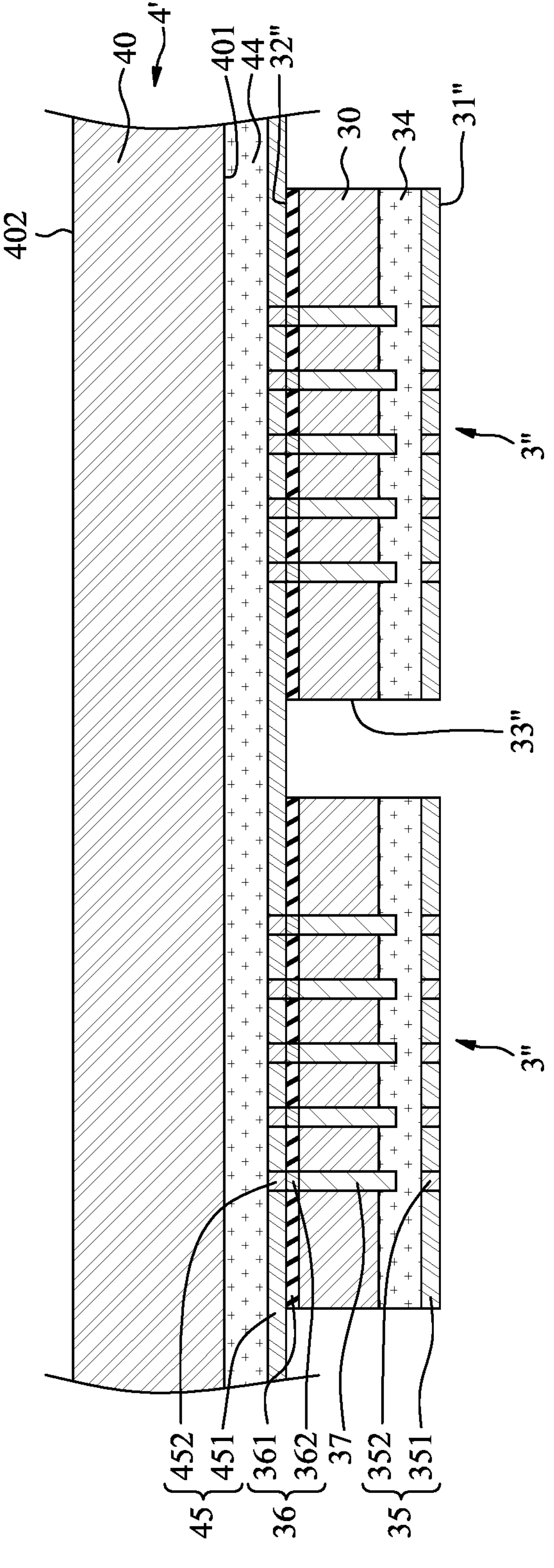

Referring to FIG. 15, the units 3" may be attached to the fourth wafer 4' through hybrid bonding. The third upper dielectric layer 361 of the unit 3" may be attached to, bonded to or adhered to the fourth lower dielectric layer 451 of the fourth wafer 4' through dielectric-to-dielectric bonding. The third upper pad 362 of the unit 3" may be attached to, joined to, or electrically connected to the fourth lower pad 452 of the fourth wafer 4' through metal-to-metal bonding.

Figure 16:
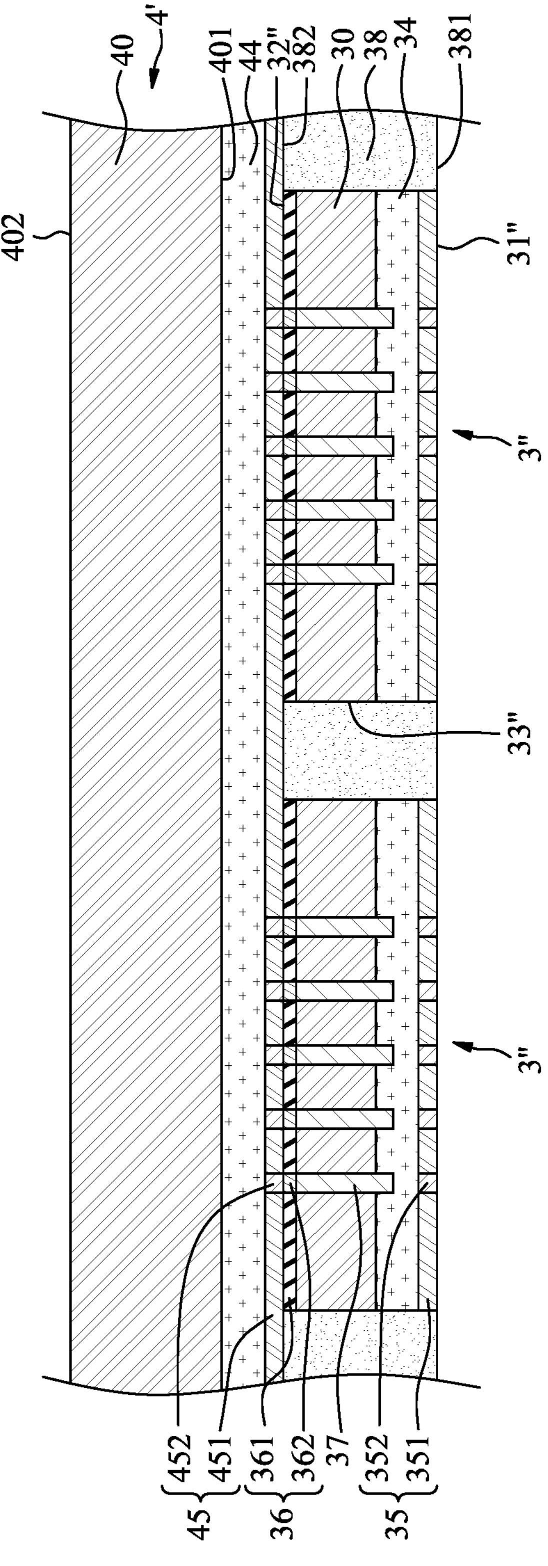

Referring to FIG. 16, a third encapsulant 38 may be formed or disposed on the fourth lower structure 45 to cover the units 3". The third encapsulant 38 may have a first surface 381 (e.g., a bottom surface) and a second surface 382

(e.g., a top surface) opposite to the first surface 381. The first surface 381 of the third encapsulant 38 may contact the fourth lower structure 45. The third encapsulant 38 may cover the lateral surface 33" and the bottom surface 31" of the unit 3".

Then, the third encapsulant 38 may be thinned from its first surface 381 (e.g., the bottom surface) to expose the units 3". The first surface 381 (e.g., the bottom surface) of the third encapsulant 38 may be substantially coplanar with the bottom surfaces 31" of the units 3".

Figure 17:
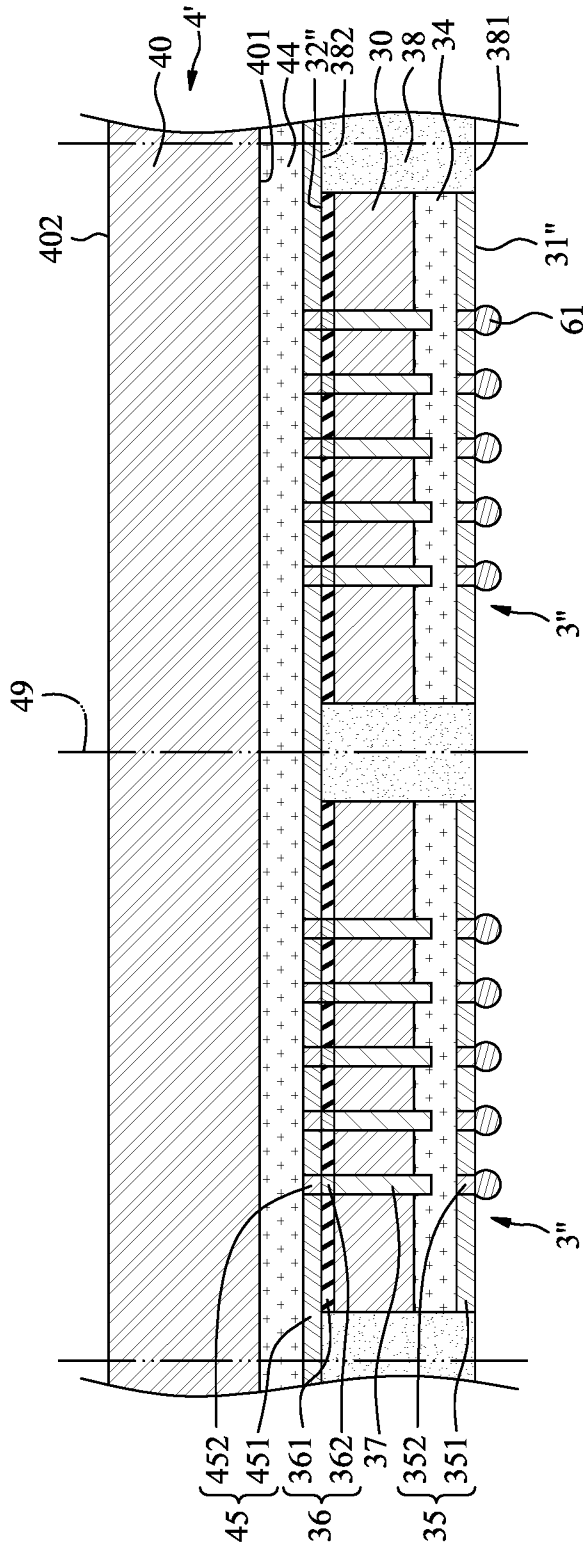

Referring to FIG. 17, a plurality of bumps 61 may be formed or disposed on the third lower pads 352 of the third lower structure 35 of the unit 3". The bumps 61 may include a reflowable material such as AgSn. Meanwhile, the fourth wafer 4' and the third encapsulant 38 may define a plurality of singulation lines 49.

Figure 18:
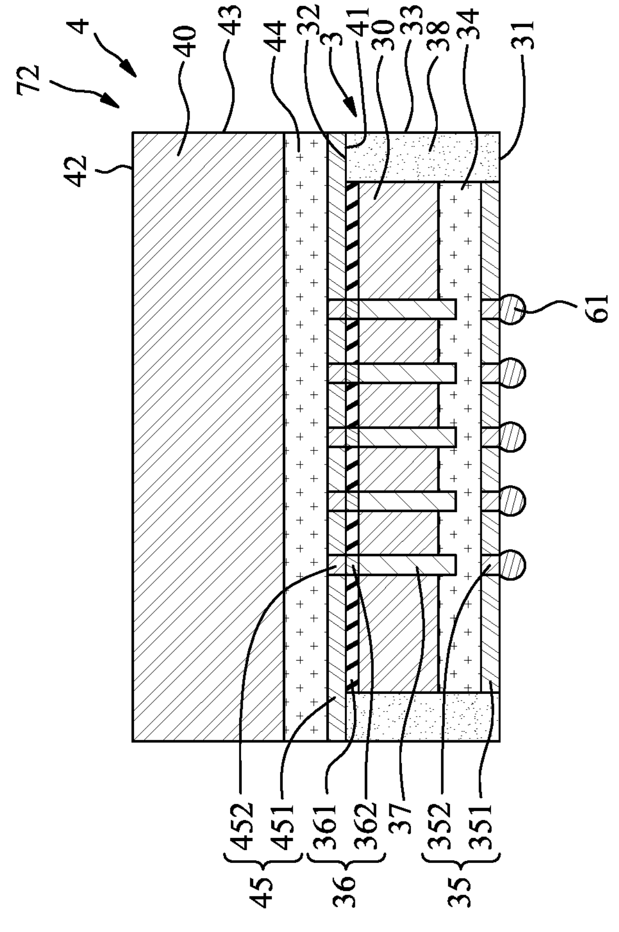

Referring to FIG. 18, the fourth wafer 4' and the third encapsulant 38 may be singulated along the singulation lines 49 to form a plurality of second assemblies 72. The second assembly 72 may include a third semiconductor chip 3 and a fourth semiconductor chip 4 stacked on the third semiconductor chip 3 and electrically connected to the third semiconductor chip 3 by hybrid bonding. The third semiconductor chip 3 may include the unit 3" and the third encapsulant 38. The fourth semiconductor chip 4 may be a portion that is singulated from the fourth wafer 4'. The second assembly 72 of FIG. 18 may be same as or similar to the second assembly 72 of FIG. 1.

Figure 19:
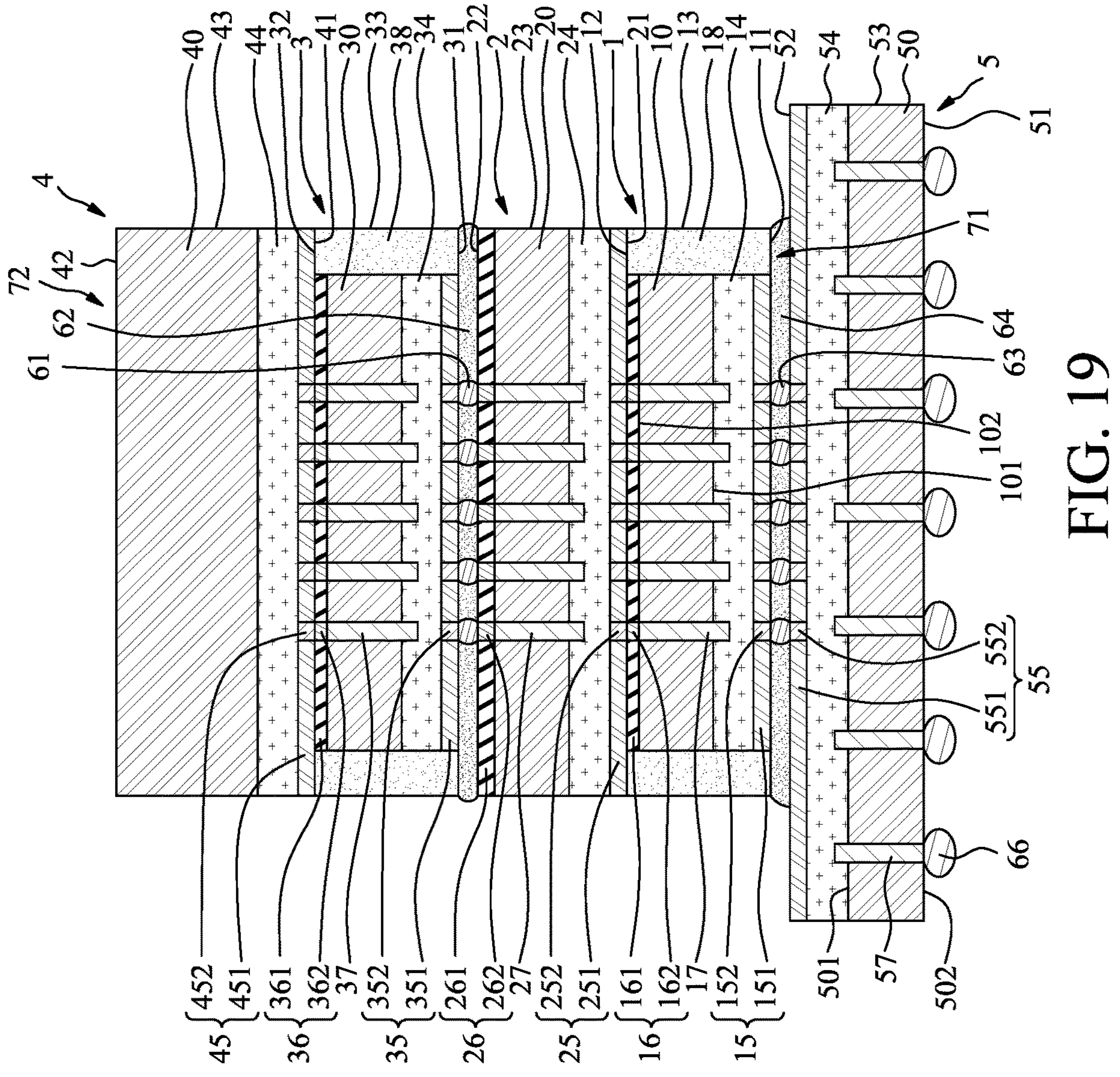

Referring to FIG. 19, the second assembly 72 may be bonded to and electrically connected to the first assembly 71 through the bumps 61. Then, an underfill 62 may be formed or disposed in a space between the second assembly 72 and the first assembly 71 to cover the bumps 61.

Then, the first assembly 71 and the second assembly 72 may be bonded to and electrically connected to a base semiconductor chip 5 through the electrical connectors 63. Then, a protection material 64 may be formed or disposed between the first semiconductor chip 1 and the base semiconductor chip 5 to cover the electrical connectors 63.

Then, a periphery encapsulant 65 may be formed to encapsulate the first semiconductor chip 1, the second semiconductor chip 2, the third semiconductor chip 3, the fourth semiconductor chip 4 and the top surface 52 of the base semiconductor chip 5 so as to obtain the electronic device 6 of FIG. 1.

Figure 20:
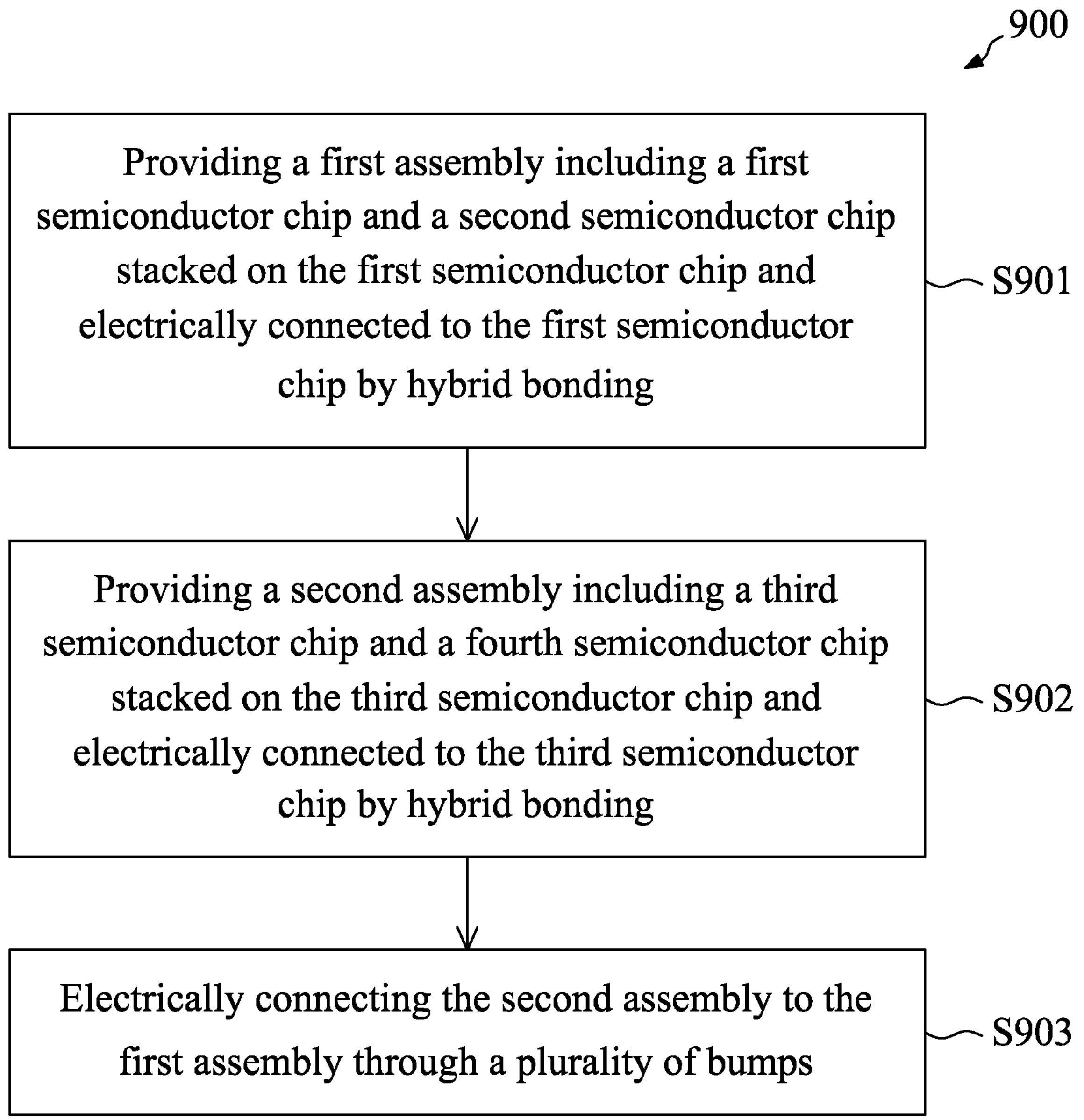
FIG. 20 is a flowchart of a method of manufacturing an electronic device, in accordance with some embodiments of the present disclosure.

FIG. 20 illustrates a flow chart of a method 900 of manufacturing an electronic device 6 in accordance with some embodiments of the present disclosure.

In some embodiments, the method 900 may include a step S901, providing a first assembly including a first semiconductor chip and a second semiconductor chip stacked on the first semiconductor chip and electrically connected to the first semiconductor chip by hybrid bonding. For example, as shown in FIG. 12, a first assembly 71 may be provided. The first assembly 71 includes a first semiconductor chip 1 and a second semiconductor chip 2 stacked on the first semiconductor chip 1 and electrically connected to the first semiconductor chip 1 by hybrid bonding.

In some embodiments, the method 900 may include a step S902, providing a second assembly including a third semiconductor chip and a fourth semiconductor chip stacked on the third semiconductor chip and electrically connected to the third semiconductor chip by hybrid bonding. For example, as shown in FIG. 18, a second assembly 72 may be provided. The second assembly 72 includes a third semiconductor chip 3 and a fourth semiconductor chip 4 stacked on the third semiconductor chip 3 and electrically connected to the third semiconductor chip 3 by hybrid bonding.

In some embodiments, the method 900 may include a step S903, electrically connecting the second assembly to the first assembly through a plurality of bumps. For example, as shown in FIG. 19, the second assembly 72 may be electrically connected to the first assembly 71 through a plurality of bumps 61.

One aspect of the present disclosure provides an electronic device including a first semiconductor chip, a second semiconductor chip and a third semiconductor chip. The second semiconductor chip is stacked on the first semiconductor chip, and is electrically connected to the first semiconductor chip by hybrid bonding. The third semiconductor chip is stacked on the second semiconductor chip, and is electrically connected to the second semiconductor chip through a plurality of bumps.

Another aspect of the present disclosure provides an electronic device including a first assembly and a second assembly. The first assembly includes a first semiconductor chip and a second semiconductor chip stacked on the first semiconductor chip and electrically connected to the first semiconductor chip by hybrid bonding. The second assembly includes a third semiconductor chip and a fourth semiconductor chip stacked on the third semiconductor chip and electrically connected to the third semiconductor chip by hybrid bonding. The second assembly is electrically connected to the first assembly through a plurality of bumps.

Another aspect of the present disclosure provides a manufacturing method. The manufacturing method includes providing a first assembly including a first semiconductor chip and a second semiconductor chip stacked on the first semiconductor chip and electrically connected to the first semiconductor chip by hybrid bonding; providing a second assembly including a third semiconductor chip and a fourth semiconductor chip stacked on the third semiconductor chip and electrically connected to the third semiconductor chip by hybrid bonding; and electrically connecting the second assembly to the first assembly through a plurality of bumps.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An electronic device, comprising:

a first semiconductor chip, wherein the first semiconductor chip comprises a first lower structure, a first conductive structure disposed on the first lower structure, a first base portion disposed on the first conductive structure, a first upper structure disposed on the first base portion, and a first encapsulant disposed around the first lower structure, the first conductive structure, the first base portion, and the first upper structure to define a lateral surface of the first semiconductor chip at an outer surface of the first encapsulant;

a second semiconductor chip stacked on the first semiconductor chip, and electrically connected to the first semiconductor chip by hybrid bonding, wherein the second semiconductor chip comprises a second lower structure, a second conductive structure disposed on the second lower structure, a second base portion disposed on the second conductive structure, and a second upper structure disposed on the second base portion, wherein the second semiconductor chip has a lateral surface defined at an outer surface of the second base portion; and a third semiconductor chip stacked on the second semiconductor chip, and electrically connected to the second semiconductor chip through a plurality of bumps, wherein the third semiconductor chip comprises a third lower structure, a third conductive structure disposed on the third lower structure, a third base portion disposed on the third conductive structure, a third upper structure disposed on the third base portion, and a third encapsulant disposed around the third lower structure, the third conductive structure, the third base portion, and the third upper structure to define a lateral surface of the third semiconductor chip at an outer surface of the third encapsulant;

wherein the second semiconductor chip is bonded between the first semiconductor chip and the third semiconductor chip at a position that the second lower structure of the second semiconductor chip is in contact with the first upper structure of the first semiconductor chip and the second upper structure of the second semiconductor chip is coupled to the third lower structure of the third semiconductor chip via the bumps;

wherein the lateral surface of the first semiconductor chip is aligned with the lateral surface of the second semiconductor chip and is aligned with the lateral surface of the third semiconductor chip;

wherein a width of the second lower structure of the second semiconductor chip is greater than a width of the first lower structure of the first semiconductor chip;

wherein a width of the first conductive structure is equal to the width of the first lower structure while a width of the second conductive structure is equal to the width of the second lower structure;

wherein a width of the third lower structure of the third semiconductor chip is equal to the width of the first lower structure of the first semiconductor chip.

2. The electronic device of claim 1, wherein a bottom surface of the second semiconductor chip contacts a top surface of the first semiconductor chip.

3. The electronic device of claim 1, wherein a bottom surface of the third semiconductor chip is spaced apart from a top surface of the second semiconductor chip.

4. The electronic device of claim 3, further comprising an underfill disposed between the bottom surface of the third semiconductor chip and the top surface of the second semiconductor chip to cover the plurality of bumps.

5. The electronic device of claim 1, wherein the first semiconductor chip further comprises a plurality of first conductive vias extending through the first base portion and electrically connecting to the first conductive structure, wherein a bottom surface of each of the first conductive vias is extended beyond a bottom surface of the first base portion and a top surface of each of the first conductive vias is coplanar with a top surface of the first base portion.

6. The electronic device of claim 5, wherein the second semiconductor chip further comprises a plurality of second conductive vias extending through the second base portion electrically connecting to the second conductive structure, wherein a bottom surface of each of the second conductive vias is extended beyond a bottom surface of the second base portion into the second conductive structure and a top surface of each of the second conductive vias is coplanar with a top surface of the second base portion.

7. The electronic device of claim 6, the third semiconductor chip further comprises a plurality of third conductive vias extending through the third base portion and electrically connecting to the third conductive structure, wherein a bottom surface of each of the third conductive vias is extended beyond a bottom surface of the third base portion into the third conductive structure, and a top surface of each of the third conductive via is coplanar with a top surface of the third base portion.

8. The electronic device of claim 7, wherein the first conductive vias extend into the first conductive structure.

9. The electronic device of claim 7, wherein the first upper structure includes a first upper dielectric layer and a plurality of first upper pads embedded in and exposed by the first upper dielectric layer, and the plurality of first upper pads contact the plurality of first conductive vias.

10. The electronic device of claim 1, further comprising a fourth semiconductor chip stacked on the third semiconductor chip, and electrically connected to the third semiconductor chip by hybrid bonding, wherein a lateral surface of the fourth semiconductor chip is aligned with the lateral surface of the third semiconductor chip, wherein the fourth semiconductor chip comprises a fourth lower structure, a fourth conductive structure disposed on the fourth lower structure, and a fourth base portion disposed on the fourth conductive structure, wherein the lateral surface of the fourth semiconductor chip is defined at an outer surface of the fourth base portion;

wherein a width of the fourth base portion of the fourth semiconductor chip is greater than the width of the third base portion of the third semiconductor chip.

11. An electronic device, comprising:

a first assembly including a first semiconductor chip and a second semiconductor chip stacked on the first semiconductor chip and electrically connected to the first semiconductor chip by hybrid bonding; and a second assembly including a third semiconductor chip and a fourth semiconductor chip stacked on the third semiconductor chip and electrically connected to the third semiconductor chip by hybrid bonding, wherein the second assembly is electrically connected to the first assembly through a plurality of bumps;

wherein the first semiconductor chip of the first assembly comprises a first base portion and a first encapsulant disposed around the first base portion;

wherein the second semiconductor chip of the first assembly comprises a second base portion;

wherein the third semiconductor chip of the second assembly comprises a third base portion and a third encapsulant disposed around the third base portion;

wherein the fourth semiconductor chip of the second assembly comprises a fourth base portion;

wherein a lateral surface of the first assembly is aligned with the lateral surface of the second assembly;

wherein an outer surface of the first encapsulant and an outer surface of the second base portion form the lateral surface of the first assembly;

wherein an outer surface of the third encapsulant and an outer surface of the fourth base portion form the lateral surface of the second assembly, such that the outer surface of the first encapsulant, the outer surface of the second base portion, the outer surface of the third encapsulant, and the outer surface of the fourth base portion are aligned with each other.

12. The electronic device of claim 11, wherein the plurality of bumps include a reflowable material.

13. The electronic device of claim 11, further comprising an underfill disposed between the second assembly and the first assembly and covering the plurality of bumps.

14. The electronic device of claim 11, wherein the second semiconductor chip and the first semiconductor chip are in face-to-face contact, the fourth semiconductor chip and the third semiconductor chip are in face-to-face contact, and the first assembly is spaced apart from the second assembly.

15. The electronic device of claim 11, wherein the first semiconductor chip further comprises:

a first conductive structure disposed on a first surface of the first base portion;

a first lower structure disposed on the first conductive structure; and a first upper structure disposed on a second surface of the first base portion opposite to the first surface of the first base portion;

wherein the second semiconductor chip further comprises:

a second conductive structure disposed on the second base portion;

a second lower structure disposed on the second conductive structure; and a second upper structure disposed on the second base portion;

wherein a width of the second base portion is greater than a width of the first base portion;

a width of the second conductive structure of the second semiconductor chip is greater than a width of the first conductive structure of the first semiconductor chip.

16. The electronic device of claim 15, wherein the first encapsulant is disposed around the first base portion, the first conductive structure, the first lower structure and the first upper structure, wherein the second semiconductor chip contacts the first encapsulant.

17. The electronic device of claim 11, wherein the third semiconductor chip further comprises:

a third conductive structure disposed on the third base portion;

a third lower structure disposed on the third conductive structure; and a third upper structure disposed on the third base portion;

wherein the fourth semiconductor chip further comprises:

a fourth conductive structure disposed on the fourth base portion; and a fourth lower structure disposed on the fourth conductive structure;

wherein a width of the fourth base portion is greater than a width of the third base portion;

wherein a width of the fourth conductive structure of the fourth semiconductor chip is greater than a width of the third conductive structure of the third semiconductor chip.

18. The electronic device of claim 17, wherein the third encapsulant is disposed around the third base portion, the third conductive structure, the third lower structure and the third upper structure, wherein the fourth semiconductor chip contacts the third encapsulant.

* * * * *